(12) United States Patent
Togawa et al.

(10) Patent No.: US 11,607,769 B2
(45) Date of Patent: *Mar. 21, 2023

(54) POLISHING APPARATUS OF SUBSTRATE

(71) Applicant: EBARA CORPORATION, Tokyo (JP)

(72) Inventors: Tetsuji Togawa, Tokyo (JP); Hiroshi Sobukawa, Tokyo (JP); Masahiro Hatakeyama, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 255 days.

This patent is subject to a terminal disclaimer.

(21) Appl. No.: 16/607,649

(22) PCT Filed: Apr. 23, 2018

(86) PCT No.: PCT/JP2018/016396
§ 371 (c)(1),
(2) Date: Oct. 23, 2019

(87) PCT Pub. No.: WO2018/198997
PCT Pub. Date: Nov. 1, 2018

(65) Prior Publication Data
US 2020/0130131 A1 Apr. 30, 2020

(30) Foreign Application Priority Data
Apr. 24, 2017 (JP) .............................. JP2017-085051

(51) Int. Cl.
*B24B 37/013* (2012.01)
*B24B 37/015* (2012.01)
(Continued)

(52) U.S. Cl.
CPC .......... *B24B 37/013* (2013.01); *B24B 37/015* (2013.01); *B24B 37/042* (2013.01);
(Continued)

(58) Field of Classification Search
CPC ... B24B 37/013; B24B 37/015; B24B 37/042; B24B 37/30; B24B 37/32; B24B 37/04;
(Continued)

(56) References Cited

U.S. PATENT DOCUMENTS

2003/0186624 A1* 10/2003 Koike .................... B24B 49/04
430/311
2006/0283839 A1 12/2006 Saito
(Continued)

FOREIGN PATENT DOCUMENTS

JP 2000-153449 A 6/2000
JP 2002-079454 A 3/2002
(Continued)

OTHER PUBLICATIONS

International Patent Application No. PCT/JP2018/016396; Int'l Search Report; dated Jun. 26, 2018; 3 pages.

*Primary Examiner* — Joel D Crandall
*Assistant Examiner* — Michael A Gump
(74) *Attorney, Agent, or Firm* — BakerHostetler

(57) ABSTRACT

A CMP polishing apparatus for flattening a quadrate substrate is provided.
A polishing apparatus for polishing a quadrate substrate is provided. The polishing apparatus includes a substrate holding portion configured to hold the quadrate substrate. The substrate holding portion includes a quadrate substrate supporting surface that supports the substrate, and an attachment mechanism that attaches a retainer member to be disposed at an outside of at least one corner portion of the substrate supporting surface.

3 Claims, 19 Drawing Sheets

(51) Int. Cl.
 *B24B 37/04* (2012.01)
 *B24B 37/30* (2012.01)
 *B24B 49/12* (2006.01)
 *B24B 53/017* (2012.01)

(52) U.S. Cl.
 CPC .............. *B24B 37/30* (2013.01); *B24B 49/12* (2013.01); *B24B 53/017* (2013.01)

(58) Field of Classification Search
 CPC ......... B24B 37/27; B24B 37/07; B24B 37/10; B24B 37/105; B24B 37/017; B24B 49/12; B24B 49/04; B24B 49/16; B24B 49/08; B24B 53/017; B24B 7/228; B24B 7/24; B24B 7/241; H01L 21/304
 USPC ....................................................... 451/288
 See application file for complete search history.

(56) References Cited

U.S. PATENT DOCUMENTS

| | | | |
|---|---|---|---|
| 2007/0049166 A1 | 3/2007 | Yamaguchi et al. | |
| 2008/0085658 A1* | 4/2008 | Katsuoka | B24B 55/02 |
| | | | 451/384 |
| 2011/0086753 A1 | 4/2011 | Moon et al. | |
| 2015/0266159 A1 | 9/2015 | Shiokawa et al. | |
| 2015/0273650 A1 | 10/2015 | Namiki et al. | |

FOREIGN PATENT DOCUMENTS

| | | | | |
|---|---|---|---|---|
| JP | 2002-239896 A | | 8/2002 | |
| JP | 2003-048149 A | | 2/2003 | |
| JP | 2003048149 A | * | 2/2003 | |
| JP | 2005-271111 A | | 10/2005 | |
| JP | 2006-297524 A | | 11/2006 | |
| JP | 2007-030157 A | | 2/2007 | |
| JP | 2007-059828 A | | 3/2007 | |
| JP | 3977037 B2 | | 9/2007 | |
| JP | 2008-108940 A | | 5/2008 | |
| JP | 2008-110471 A | | 5/2008 | |
| JP | 2009-291886 A | | 12/2009 | |
| JP | 2011-079131 A | | 4/2011 | |
| JP | 5218896 B2 | | 6/2013 | |
| JP | 2013-255994 A | | 12/2013 | |
| JP | 2014-027299 A | | 2/2014 | |
| JP | 2015-193068 A | | 11/2015 | |
| JP | 2015-196211 A | | 11/2015 | |
| JP | 2015196211 A | * | 11/2015 | ........... B24B 37/015 |
| JP | 2016-155180 A | | 9/2016 | |
| TW | 383266 B | | 3/2000 | |
| TW | 201306994 A1 | | 2/2013 | |

\* cited by examiner

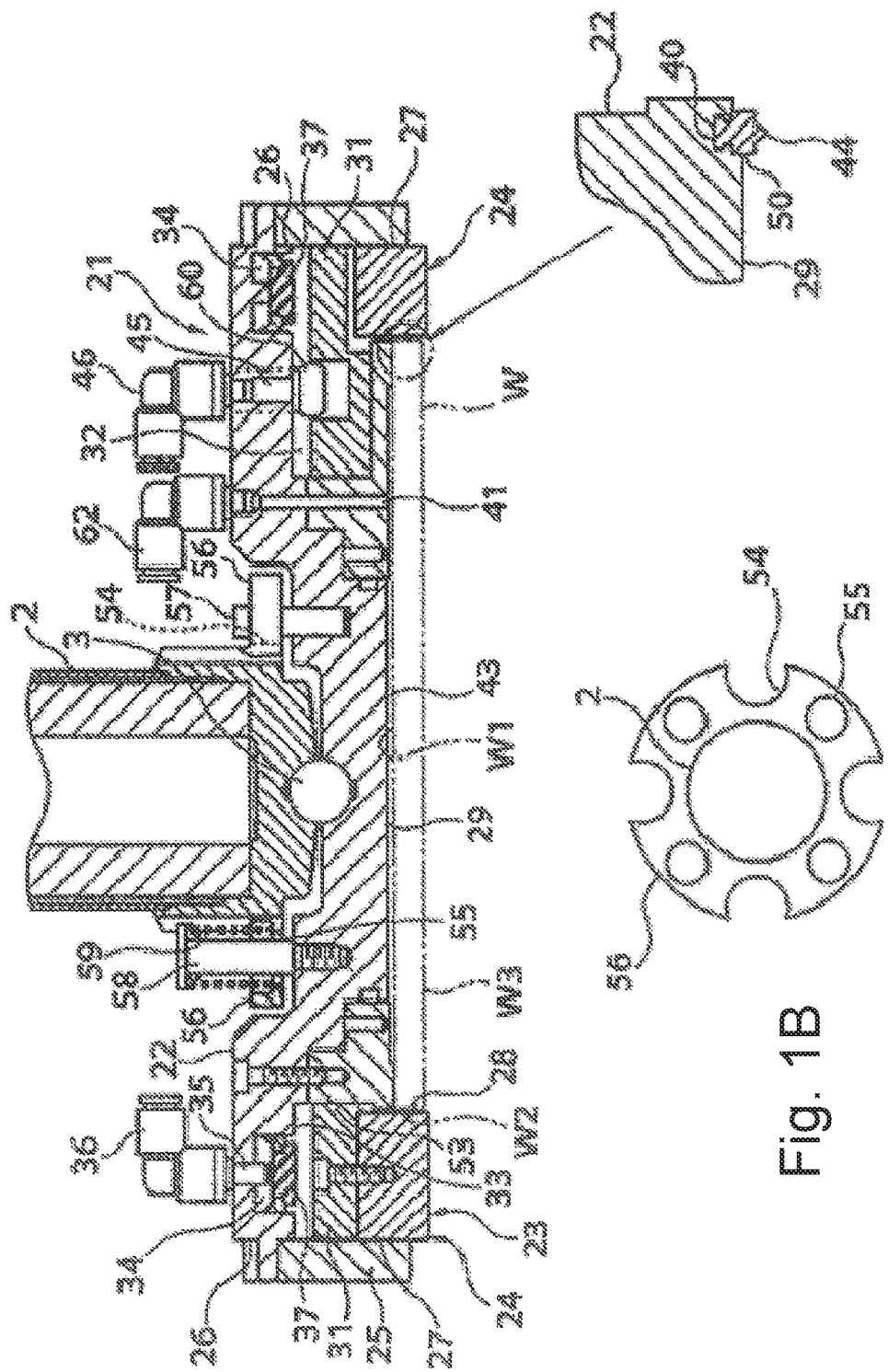

POLISHING APPARATUS OF SUBSTRATE

TECHNICAL FIELD

The present invention relates to a polishing apparatus of a substrate.

BACKGROUND ART

To manufacture a semiconductor device, a chemical mechanical polishing (CMP) apparatus has been used for flattening a surface of a substrate. The substrate used for manufacturing a semiconductor device is frequently disc-shaped. Also, not limited to the semiconductor device, a demand for flatness when a surface of a quadrate substrate such as a CCL (Copper Clad Laminate) substrate, a PCB (Printed Circuit Board) substrate, a photomask substrate and a display panel is flattened has been increased. Moreover, a demand for flattening a surface of a package substrate in which an electronic device such as the PCB substrate is disposed has been increased.

CITATION LIST

Patent Literature

PTL 1: Japanese Patent Laid-Open No. 2003-48149
PTL 2: Japanese Patent Laid-Open No. 2008-110471
PTL 3: Japanese Patent Laid-Open No. 2005-271111

SUMMARY OF INVENTION

Technical Problem

When CMP polishing for flattening the quadrate substrate is executed, excessive polishing may occur at an end portion such as a corner portion of the substrate. Also, excessive polishing or insufficient polishing may occur at an end portion such as a corner portion of the substrate or other portions. When excessive polishing or insufficient polishing occurs in the substrate, a surface of the substrate after polishing becomes uneven. Especially, in a case of a large substrate, ununiformity easily occurs, in which an amount of polishing differs between a center portion and an end portion of the substrate. Accordingly, one object is to provide a CMP polishing apparatus for flattening a quadrate substrate.

Solution to Problem

[First aspect] According to a first aspect, there is provided a polishing apparatus for polishing a quadrate substrate, the polishing apparatus including: a substrate holding portion configured to hold the quadrate substrate, the substrate holding portion including: a quadrate substrate supporting surface for supporting the substrate; and an attachment mechanism configured to attach a retainer member to be disposed at an outside of at least one corner portion of the substrate supporting surface.

[Second aspect] According to a second aspect, the polishing apparatus according to the first aspect further includes a retainer member to be disposed at the outside of at least one corner portion of the substrate supporting surface.

[Third aspect] According to a third aspect, the polishing apparatus according to the first aspect or the second aspect further includes a moving mechanism configured to move the retainer member attached to the substrate holding portion in a direction perpendicular to the substrate supporting surface.

[Fourth aspect] According to a fourth aspect, in the polishing apparatus according to any one of the first aspect to the third aspect, the substrate supporting surface includes a plurality of regions, each region having an elastic film, and the elastic film of each region can be independently deformed due to fluid pressure.

[Fifth aspect] According to a fifth aspect, in the polishing apparatus according to the fourth aspect, the plurality of regions of the substrate supporting surface include a region corresponding to a corner portion of the quadrate substrate and a region corresponding to a center portion of the quadrate substrate.

[Sixth aspect] According to a sixth aspect, there is provided a polishing apparatus for polishing a quadrate substrate, the polishing apparatus including: a substrate holding portion configured to hold the quadrate substrate, the substrate holding portion including: a quadrate substrate supporting surface for supporting the substrate; and an attachment mechanism configured to attach a circular or oval retainer member configured to surround the substrate supporting surface.

[Seventh aspect] According to a seventh aspect, the polishing apparatus according to the sixth aspect further includes a circular or oval retainer member configured to surround the substrate supporting surface.

[Eighth aspect] According to an eighth aspect, in the polishing apparatus according to the seventh aspect, the retainer member includes a plurality of grooves radially extending from an inner side at which the substrate is disposed.

[Ninth aspect] According to a ninth aspect, in the polishing apparatus according to the eighth aspect, in at least one of the plurality of grooves, an outer opening is larger than an inner opening of the groove.

[Tenth aspect] According to a tenth aspect, the polishing apparatus according to any one of the first aspect to the ninth aspect further includes: a platen that includes a polishing surface for polishing the substrate; and a substrate holding head configured to hold the substrate to press the substrate to the polishing surface, wherein the substrate holding head includes the substrate holding portion.

[Eleventh aspect] According to an eleventh aspect, the polishing apparatus according to the tenth aspect further includes: a moving mechanism configured to move the polishing head to be parallel with the polishing surface of the platen; and a controller for controlling an operation of the moving mechanism, wherein the controller controls the operation of the moving mechanism such that the substrate partially protrudes from the polishing surface of the platen in a state that the substrate holding head holds the substrate.

[Twelfth aspect] According to a twelfth aspect, in the polishing apparatus according to the tenth aspect or the eleventh aspect, the platen includes a sensor configured to detect an end point of polishing of the substrate.

[Thirteenth aspect] According to a thirteenth aspect, the polishing apparatus according to any one of the tenth aspect to the twelfth aspect further includes a temperature controlling device configured to control a temperature of the polishing surface of the platen.

[Fourteenth aspect] According to a fourteenth aspect, the polishing apparatus according to any one of the first aspect to the ninth aspect further includes: a table for holding the substrate and is rotatable; and a polishing head including a polishing surface for polishing the substrate, wherein the table includes the substrate holding portion.

[Fifteenth aspect] According to a fifteenth aspect, in the polishing apparatus according to the fourteenth aspect, an area of the polishing surface is smaller than an area of a surface to be polished of the substrate.

[Sixteenth aspect] According to a sixteenth aspect, the polishing apparatus according to the fifteenth aspect further includes a plurality of polishing heads, each of the polishing heads including a polishing surface for polishing the substrate.

[Seventeenth aspect] According to a seventeenth aspect, in the polishing apparatus according to any one of the fourteenth aspect to the sixteenth aspect, the polishing head includes a sensor configured to detect an end point of polishing of the substrate.

[Eighteenth aspect] According to an eighteenth aspect, in the polishing apparatus according to any one of the fourteenth to the seventeenth aspect, the polishing head includes a nozzle configured to supply liquid to a surface of the substrate.

[Nineteenth aspect] According to a nineteenth aspect, in the polishing apparatus according to any one of the fourteenth aspect to the eighteenth aspect, the table includes a levelness adjustment mechanism.

[Twentieth aspect] According to a twentieth aspect, in the polishing apparatus according to the seventeenth aspect, the polishing head is attached to a head fixing member which can swing, and configured such that the end point of polishing of the substrate is detected by detecting variation of swinging torque of the head fixing member.

BRIEF DESCRIPTION OF DRAWINGS

FIGS. 1A, 1B, 1C are drawings for explaining a substrate holding head used for a polishing apparatus 1 according to one embodiment.

DESCRIPTION OF EMBODIMENTS

Hereinafter, embodiments of a polishing apparatus according to the present invention are explained with reference to attached drawings. In the attached drawings, the same or similar components are applied the same or similar reference signs, and in an explanation in each embodiment, a duplicated explanation relating to the same or similar components may be omitted. Also, characteristics shown in each embodiment can be applied to other embodiments unless any inconsistency occurs.

Figure 2A:
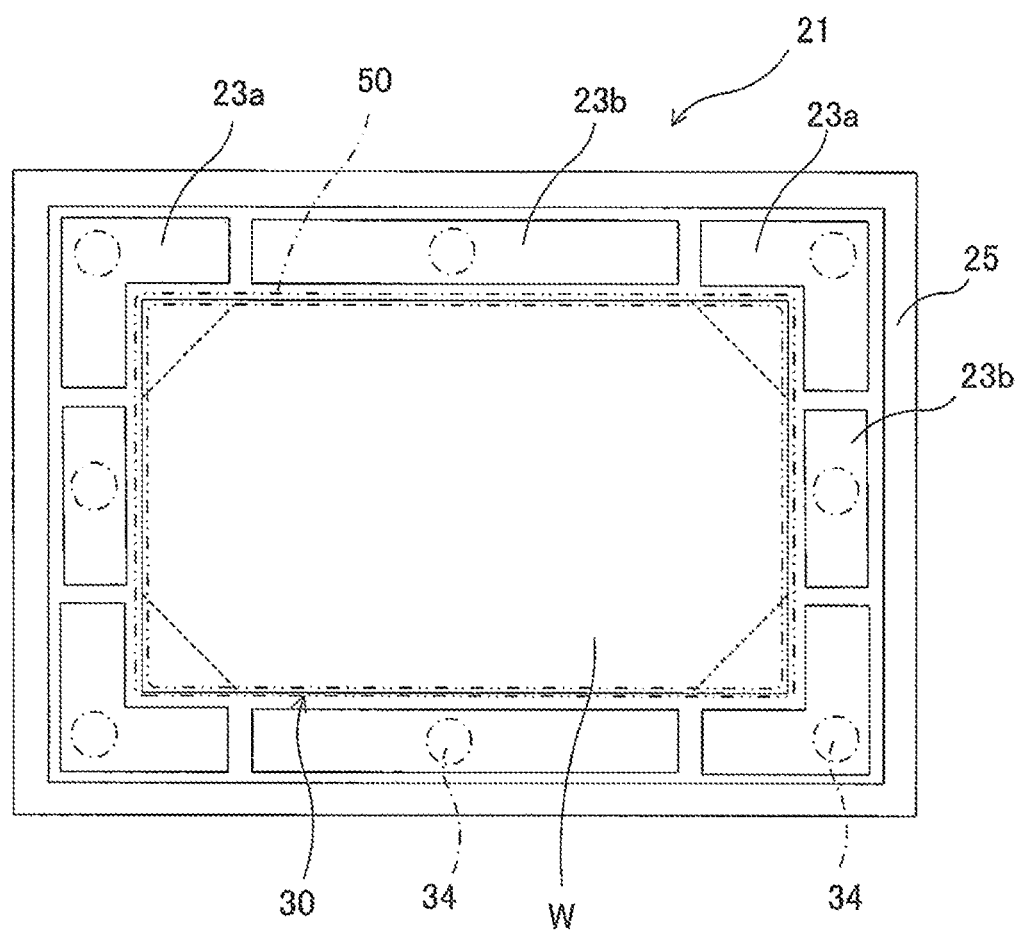
FIG. 2A is a bottom view of the substrate holding head shown in FIG. 1A.
Figure 2B:
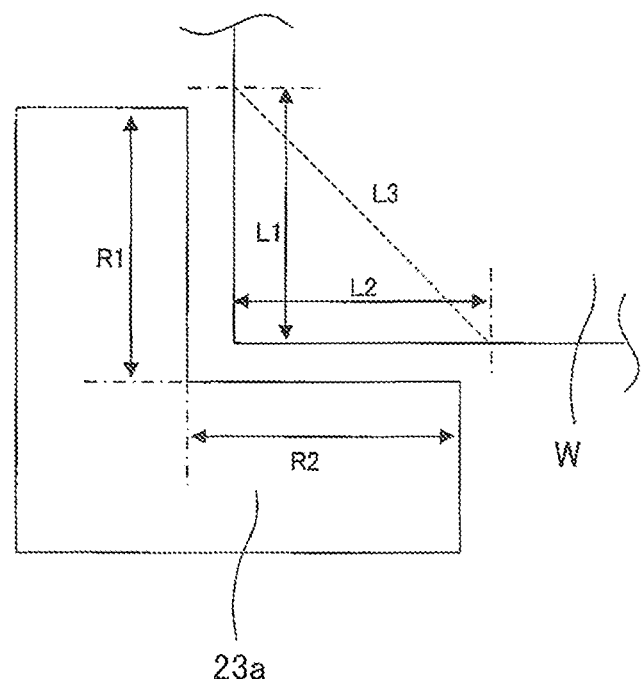
FIG. 2B is an enlarged view of a portion adjacent to a corner portion of a substrate W shown in FIG. 2A.
Figure 3:
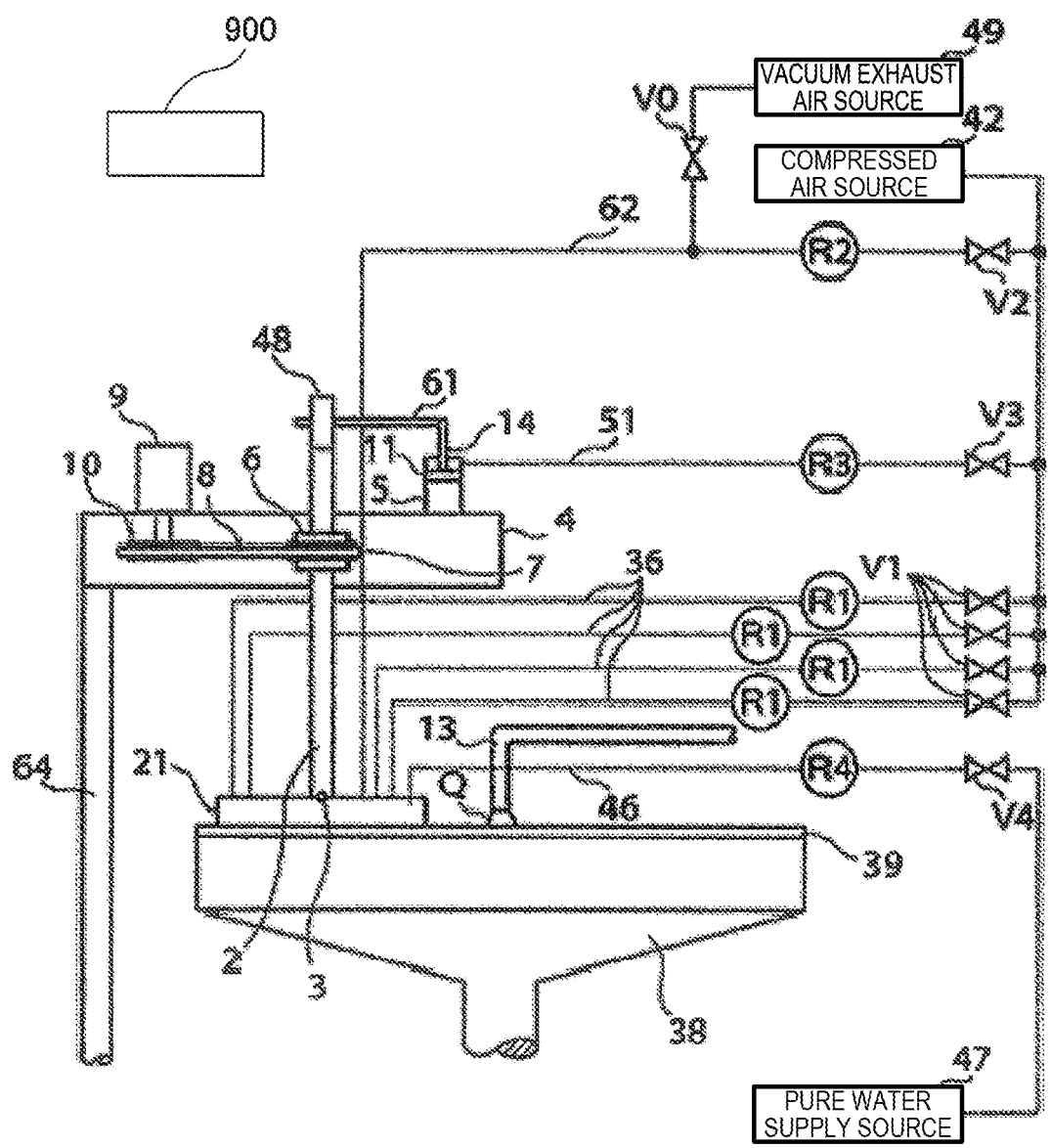
FIG. 3 is a concept diagram showing a configuration of a polishing apparatus using the substrate holding head.

FIG. 1 is drawings for explaining a substrate holding head 21 used for a polishing apparatus 1 according to one embodiment (see FIG. 3). FIG. 1A is a cross-sectional view of the substrate holding head 21 used for the polishing apparatus 1 (see FIG. 3) according to one embodiment. FIG. 1B is a plan view which shows a flange portion 56 alone shown in FIG. 1A. FIG. 1C is an enlarged view of a portion adjacent to an outer peripheral portion of a lower surface 29 which holds a substrate W shown in FIG. 1A. FIG. 2A is a bottom view of the substrate holding head 21 shown in FIG. 1A. With reference to FIGS. 1A to 1C, FIG. 2A and FIG. 2B, a configuration of the substrate holding head 21 and a configuration of its peripheral parts are explained. The substrate holding head 21 includes a head main body 22, a retainer member 23 and a peripheral member 25.

As shown in FIG. 1A, the retainer member 23 is disposed at a lower outer peripheral portion of the head main body 22. In an embodiment shown in FIG. 2A, four retainer members 23a are disposed at portions corresponding to four corner portions of the substrate W, and four retainer members 23b are further disposed at portions corresponding to four side portions of the substrate W. In the substrate holding head 21 shown in FIGS. 1 and 2, the outer peripheral member 25 which is annular and contacts to and cover an upper outer peripheral side surface 26 of the head main body 22 and each outer peripheral side surface 27 of the retainer member 23 is disposed. The outer peripheral shape of the outer peripheral member 25 may be a quadrate. The head main body 22 and the retainer member 23 can absorb, house and hold the quadrate substrate W (shown by a phantom line in FIG. 1A) which is an object to be polished as described later. In this state, the lower surface 29 as a substrate supporting surface of the head main body 22 directly faces a rear surface W1 of the substrate W, while an inner peripheral side surface 28 of the retainer member 23 directly faces a side surface W2 of the substrate W.

The substrate W may be a silicon substrate, a glass substrate, a resin substrate, a substrate including a multilayer wiring substrate layer and a package substrate on which an electronic device is disposed. The material of the retainer member 23 may be changed depending on the substrate W to be polished. For example, when the substrate W is the silicon substrate, a polymer material or a ceramic material are generally used as the material of the retainer member 23, and for example, hardened plastic such as PPS (polyphenylene sulfide) and PEEK (polyetheretherketone) may be used. Also, when the substrate W is the glass substrate, the material of the retainer member 23 may be glass which is similar to the substrate.

As shown in FIG. 3, a platen 38 is disposed on a lower side in a perpendicular direction of the substrate holding head 21. An abrasive cloth 39 (see FIG. 3) is attached at an upper surface of the platen 38. The abrasive cloth 39 is configured to contact to a surface to be polished W3 of the substrate W. In the abrasive cloth 39, a surface which contacts to the surface to be polished W3 of the substrate W is a polishing surface.

As shown in FIG. 2A, the inner peripheral side surface 28 of each retainer member 23 forms a quadrate opening 30 as a whole. The quadrate of the opening 30 is formed to be slightly larger than an outer peripheral quadrate of the substrate W. FIG. 2A shows the retainer member 23 having the retainer members 23a provided at the portions corresponding to the corner portions of the substrate W and the retainer members 23b provided at the portions at the portions corresponding to the side portions of the substrate W. The retainer members 23a at the corner portions are to prevent excessive polishing which easily occurs at the corner portions of the substrate W when the substrate W is polished. As one embodiment, the retainer members 23b provided at positions corresponding to side portions of the substrate W may be omitted.

In the substrate holding head 21, each retainer member 23 is fixed by an upper member 31 positioned at an upper portion of the retainer member 23. The retainer member 23 can be removably fixed to the upper member 31 using a fixing member such as a bolt. The upper member 31 is partially inserted into a recess 32 formed at a lower outer peripheral side surface 53 of the head main body 22. Each retainer member 23 is inserted into the recess 32 to be relatively vertically movable to the lower surface 29 which is a substrate holding surface. A pin 60 for preventing rotation of the retainer member 23, which is driven to penetrate through the head main body 22, engages with a portion of the upper member 31 inserted into the recess 32. A space 34 recessed to be columnar is formed at an intermediate lower surface 33 of the head main body 22, and each space 34 is positioned above the upper member 31 of each retainer member 23. Also, each space 34 is positioned at a center portion in a longitudinal direction of the upper member 31 (see FIG. 2A).

Each space 34 has each air supply nozzle 35 at its upper portion, and each air supply nozzle 35 is connected to each air supply line 36. Each air supply line 36 is connected to a compressed air source 42 (see FIG. 3) which supplies compressed air as a pressure fluid via each valve V1 which is turning-off means (see FIG. 3) and each first air regulator R1 which is controlling means (see FIG. 3). The pressure of each space 34 is independently controlled by each first air regulator R1 and can be independently changed. Thus, each retainer member 23 can be pressed to the polishing surface independently or independently from the substrate W.

A sealing member 37 is inserted to the space 34, and can seal the space 34 to maintain pressure in the space 34. The sealing member 37 can move in the space 34 vertically in FIG. 1A. The sealing member 37 is pressed downward in FIG. 1A due to the pressure of the space 34 to press the upper member 31 of the retainer member 23. Consequently, the retainer member 23 is pressed toward the platen 38, that is, the abrasive cloth 39 and the polishing surface.

As described above, the retainer member 23 can be removably fixed to the upper member 31. Consequently, depending on the material of the substrate W to be polished and the size of a region where excessive polishing occurs, the material or the dimension of the retainer member 23 can be changed. FIG. 2B is an enlarged view of a portion adjacent to the corner portion of the substrate W shown in FIG. 2A. In FIG. 2B, it is assumed that excessive polishing occurs in a region shown by a triangle surrounded by L1, L2 and L3 at the corner portion of the substrate W. The region where excessive polishing occurs can be previously measured by an experiment etc. The length of each side (R1, R2) of the L-shaped retainer member 23 disposed at the corner portion of the substrate W may be selected in accordance with L1 and L2 of the excessive polishing region. For example, the retainer member 23 in which L1 and R1 have the same size and L2 and R2 have the same size can be selected. Also, depending on the magnitude of excessive polishing occurring at the substrate W, a pressure force to the polishing surface by the retainer member 23 can be adjusted.

The lower surface 29 of the head main body 22 is the substrate supporting surface with the shape of a quadrate having substantially the same size as the substrate W. An annular groove 40 is formed at an outer peripheral portion of the lower surface 29 which holds the substrate W, and an annular rubber member 50 as an elastic ring (shown by a phantom line in FIG. 2A, and its outer periphery is shown to correspond to an outer periphery of the substrate W) is fitted in the groove 40 (FIG. 1C). In a state that the rubber member 50 is fitted to the groove 40, a convex portion 44 of the rubber member 50 protrudes from the lower surface 29, and the convex portion 44 contacts to the rear surface W1 of the substrate W which is an object to be polished. The lower surface 29, the convex portion 44 of the rubber member 50 and the rear surface W1 of the substrate W defines a space 43 as a space.

In the head main body 22, a second air supply nozzle 41 communicating with the space 43 is formed, and the second air supply nozzle 41 is connected to a second air supply line 62 which is a supply line. The second air supply line 62 is connected to the compressed air source 42 (see FIG. 3) via a second valve V2 (see FIG. 3) and a second air regulator R2 (see FIG. 3), and is connected to a vacuum exhaust air source 49 (see FIG. 3) via a valve VO (see FIG. 3). The pressure of the space 43 is controlled to a predetermined pressure by the second air regulator R2 in a state that the valve VO is closed and the second valve V2 is open, and due to this pressure, the substrate W is pressed toward the platen 38. Also, when the valve VO is open in a state that the second valve V2 is closed, the space 43 becomes vacuum and the substrate W is absorbed by the lower surface 29.

The rubber member 50 is made of silicon rubber and fluorine-contained rubber etc., and has the convex portion 44 with a V-shaped cross section having a round tip portion. Since the cross-sectional shape of the convex portion 44 is V-shaped having the round tip portion, even when the substrate W is not completely horizontal on the platen 38, a contact area of the rubber member 50 and the rear surface W1 of the substrate W is minimum, and moreover, the space 43 can be stably sealed to maintain the pressure of the space 43.

In the head main body 22, a pure water supply nozzle 45 connected to a pure water supply line 46 is formed to supply pure water to the upper member 31 of each retainer member 23 and the recess 32 of the substrate holding head main body 22 to wash away abrasive fluid (slurry) poured into gaps at a periphery of the retainer member 23. The pure water supply line 46 is connected to a pure water supply source 47 (see FIG. 3) via a pure water valve V4 (see FIG. 3) and a pure water regulator R4 (see FIG. 3). Due to the pure water regulator R4, a supply pressure of pure water is controlled to a predetermined pressure or a supply amount is controlled to a predetermined amount.

The substrate holding head 21 is connected to a head shaft 2 via a ceramic bearing ball 3. At a lower portion of the head shaft 2, the flange portion 56 which has a notch 54 at its peripheral portion and a penetration hole 55 at a portion adjacent to the peripheral portion is formed (see FIG. 1B). A first pin 57 driven to the head main body 22 engages with the notch 54 such that torque can be transmitted to the engaged first pin 57 from the notch 54. Consequently, torque is transmitted from the head shaft 2 to the substrate holding head 21. A flanged second pin 58 screwed into the head main body 22 is inserted into the penetration hole 55, and a compression spring 59 is provided between the flange portion 56 and the second pin 58. As a result, due to a balance of the compression spring 59, the head shaft 2 can be held perpendicularly.

Additionally, the space 34 recessed in the intermediate lower surface 33 of the head main body 22 is formed to be columnar, and positioned above the upper member 31 of the retainer member 23. Also, in the embodiment shown in FIG. 2, the space 34 is positioned at the center portion in the longitudinal direction of the upper member 31. The number of spaces 34 can correspond to the number of the retainer members 23, and as in the embodiment shown in FIG. 2, when eight retainer members 23 are provided, eight spaces 34 are provided. When the retainer members 23a are provided only at the corner portions, four spaces 34 are provided. Additionally, the shape, position and the number of spaces 34 are arbitrary. For example, the space 34 may be a rectangular solid, not columnar, and for each retainer member 23, a plurality of spaces 34, for example two (for example, both end portions of the retainer member 23) or three (for example, both end portions and a center portion of the retainer member 23) spaces 34 may be provided.

FIG. 3 is a concept diagram showing a configuration of the polishing apparatus 1 using the substrate holding head 21. With reference to FIG. 3, also with reference to FIGS. 1 and 2 appropriately, the configuration of the polishing apparatus 1 is explained. The polishing apparatus 1 includes the substrate holding head 21, the bearing ball 3, the head shaft 2, the platen 38, the abrasive cloth 39, the first air supply line 36, the second air supply line 62, a first air regulator R1, the second air regulator R2, the pure water supply line 46 and the pure water regulator R4. Further, the polishing apparatus 1 includes a head fixing member 4, a connecting shaft 48, an air cylinder 5, a piston 14, a third air supply line 51, a third air regulator R3, a rotating cylinder 6, a timing pulley 7, a timing belt 8, a timing pulley 10, a motor 9 and an abrasive fluid supply nozzle 13 etc.

As described above, the substrate holding head 21 engages with the head shaft 2 via the bearing ball 3. The head shaft 2 engages with the head fixing member 4 via a not shown bearing to be freely lifted and rotated, and is connected to the piston 14 in the air cylinder 5 via the connecting shaft 48 and a connecting rod 61. The air cylinder 5 is connected to the third air supply line 51. The third air supply line 51 is connected to the compressed air source 42 via a third valve V3 and the third air regulator R3. The pressure of the air cylinder 5 is controlled to a predetermined pressure by the third air regulator R3.

Due to the pressure of the air cylinder 5, the piston 14 is vertically moved, and due to the vertical movement of the piston 14, the connecting shaft 48 and the substrate holding head shaft 2 are vertically moved via the connecting rod 61, whereby the substrate W held at the lower surface of the substrate holding head 21 is away from the platen 38 or pressed toward the platen 38. Also, an upper surface of the substrate holding head 21 and a lower end surface of the head shaft 2 form a ball bearing which houses the bearing ball 3, and the substrate holding head 21 can be inclined about the bearing ball 3 to the platen 38 or the abrasive cloth 39 via the bearing ball 3. Additionally, the bearing ball 3 is positioned at the center of the head shaft 2.

Also, the rotating cylinder 6 is attached to the head shaft 2, and the rotating cylinder 6 has the timing pulley 7 at its outer periphery. Moreover, the timing pulley 7 is connected to the timing pulley 10 provided at the motor 9 fixed to the head fixing member 4 (also called as an arm) via a timing belt 8. Accordingly, when the motor 9 is driven to rotate, the rotating cylinder 6 and the head shaft 2 are rotated as a unit via the timing belt 8 and the timing pulley 7, and due to the rotation of the head shaft 2, the substrate holding head 21 is rotated. Also, an end of the head fixing member 4 is supported by a swinging shaft 64 to be freely swinging. Additionally, the rotation from the head shaft 2 is not transmitted to the connecting shaft 48.

The polishing apparatus 1 includes a controller 900, and various sensors or operation mechanisms provided to the polishing apparatus 1 can be controlled by the controller 900. The controller 900 can be constituted by a general computer which has an input/output device, an arithmetic device and a memory device etc.

Next, with reference to FIGS. 1, 2 and 3, an operation of the polishing apparatus 1 is explained. In the polishing apparatus 1 thus configured, the substrate W is housed in the opening 30 formed at the lower surface 29 of the substrate holding head 21, the valve VO is opened to make the pressure of the space 43 vacuum, and the substrate W is absorbed by the lower surface 29. Additionally, more specifically, only an outer periphery of the rear surface W1 of the substrate W contacts to the convex portion 44 of the rubber member 50.

In an initial state, the substrate holding head 21 is separated from the platen 38 and positioned at an upper portion of the platen 38. Next, the valve V3 is opened from a closed state to obtain a predetermined pressure by controlling an air pressure supplied from the compressed air source 42 passing through the third air supply line 51 to the air cylinder 5 by the third air regulator R3. When the pressure of the air cylinder 5 reaches the predetermined pressure, the piston 14 moves down, so that the head shaft 2 and the substrate holding head 21 move down via the connecting shaft 48, whereby the substrate W is disposed on a polishing surface 39A of the abrasive cloth 39. Since the rotating cylinder 6 is attached to the substrate holding head shaft 2 and freely relatively movable in an axial direction, even when the substrate holding head shaft 2 is vertically moved, the rotating cylinder 6 is static to the head fixing member 4.

After the substrate W is disposed on the abrasive cloth 39, the valve V3 maintains the open state, so that the substrate holding head 21 presses the substrate W toward the abrasive cloth 39 due to a pressing force to the piston 14 caused by the pressure in the air cylinder 5. Additionally, pressing the substrate W toward the abrasive cloth 39 also means pressing the substrate W to the platen 38.

Next, the valve VO is closed from the opened state, further the valve V2 is opened from the closed state, and air pressure of the space 43 supplied from the compressed air source 42 passing through the second air supply line 62 and the second air supply nozzle 41 is controlled to a predetermined pressure by the second air regulator R2. By allowing the air pressure of the space 43 to be the predetermined pressure, the substrate W is pressed toward the abrasive cloth 39. Applying pressure to the space 43 allows pressing with a uniform force of the center portion of the substrate W, which improves flatness of the substrate W due to polishing. Also, since the space 43 is made, even if abrasive fluid or grinding sludge is moved to the rear surface W1 of the substrate W, no flaw is formed at the rear surface W1.

Additionally, since the convex portion 44 of the rubber member 50 contacts only to the outer periphery of the rear surface W1 of the substrate W, displacement of the shape of the rear surface W1 of the substrate W from a planar surface and inclination from a horizontal plane can be absorbed more firmly, the space 43 can be sealed more stably and a stabled pressing force can be applied to the substrate W, whereby flatness of the substrate W due to polishing can be further improved.

Additionally, when the substrate is polished by an apparatus which does not include the rubber member 50, polishing can be executed while the entire rear surface of the substrate is directly contacted to the lower surface of the substrate holding head.

Next, all the valves V1 are opened from the closed state, air pressure of the space 43 supplied from the compressed air source 42 passing through the first air supply line 36 and the first air supply nozzle 35 is independently controlled by the first air regulator R1 to an independent predetermined pressure. By allowing the air pressure of the space 34 to be a predetermined pressure, the sealing member 37 presses the upper member 31 of the retainer member 23 with a predetermined pressing force, and the retainer member 23 is pressed toward the abrasive cloth 39 (the platen 38) with respective pressing forces. Also, as described above, the retainer member 23 is pressed toward the platen 38 independently from the substrate W to be vertically moved independently from the substrate W. Accordingly, each retainer member 23 can independently press the platen 38 at a periphery of the substrate W, and can be vertically moved independently from the substrate W corresponding to irregularities at a surface of the abrasive cloth 39 and predicting excessive polishing of the substrate W. Due to each retainer member 23, excessive polishing or insufficient polishing at the corner portions and a portion adjacent to each side portion of the substrate W can be mitigated, which improves flatness of the substrate W.

As described above, each retainer member 23 can be moved independently from each other. Accordingly, each retainer member 23 moves to press the periphery of the substrate W not influenced by the movement of other retainer members 23, so that a degree of elimination of waviness of the substrate W due to polishing is improved and flatness after the polishing is improved.

Since each retainer member 23 can be pressed with each independently controlled pressing force, an independent pressing force can be applied to each corner portion and each region adjacent to each side portion of the quadrate of the substrate W. Consequently, for example, a pressing force can be made weaker at the retainer member 23 adjacent to a portion at which a polishing rate of the substrate W is desired to be larger, while a pressing force can be made stronger at the retainer member 23 adjacent to a portion at which a polishing rate is desired to be smaller. Also, a pressing force can be made stronger at the retainer member 23 adjacent to a portion at which the substrate W is reflexed, while a pressing force can be made weaker at the retainer member 23 adjacent to a portion at which no warpage is generated. In this way, control of the pressing force improves the degree of elimination of waviness of the substrate W due to polishing and flatness after the polishing can be improved.

Next, the valve V4 is opened from the closed state, and pure water is supplied to the recess 32 of the substrate holding head main body 22 from the pure water supply source 47 passing through the pure water supply line 46 and the pure water supply nozzle 45. The supply pressure or the amount of supply of the pure water is controlled to a predetermined pressure or a predetermined amount by the pure water regulator R4. Due to supply of the pure water, abrasive fluid etc. poured into the gaps at the periphery of the retainer member 23 can be washed away.

Next, abrasive fluid Q which is polishing solution is poured from the abrasive fluid supply nozzle 13 to an upper surface of the abrasive cloth 39, and the motor 9 is driven to rotate. When the motor 9 rotates, the timing pulley 10 rotates, and the timing pulley 7 rotates via the timing belt 8, whereby the rotation is transmitted to the substrate holding head shaft 2. When the substrate holding head shaft 2 rotates, the substrate holding head 21 rotates, and the substrate W pressed to the abrasive cloth 39 by the substrate holding head 21 is rotated. At this time, the retainer member 23 rotates synchronized with the substrate W. On the other hand, the platen 38 also rotates in the same direction as a rotating direction of the substrate holding head 21 by a not shown rotation drive unit, which causes a relative movement between the substrate W and the polishing surface 39A of the abrasive cloth 39 and chemical and mechanical polishing of the surface to be polished W3 of the substrate W is executed. Since the abrasive fluid Q which is polishing solution is poured from the abrasive fluid supply nozzle 13 to the upper surface of the abrasive cloth 39, the abrasive fluid Q is maintained at the abrasive cloth 39, and the substrate W is polished in a state that the abrasive fluid Q is remained between the surface to be polished W3 and the abrasive cloth 39.

Figure 4A:
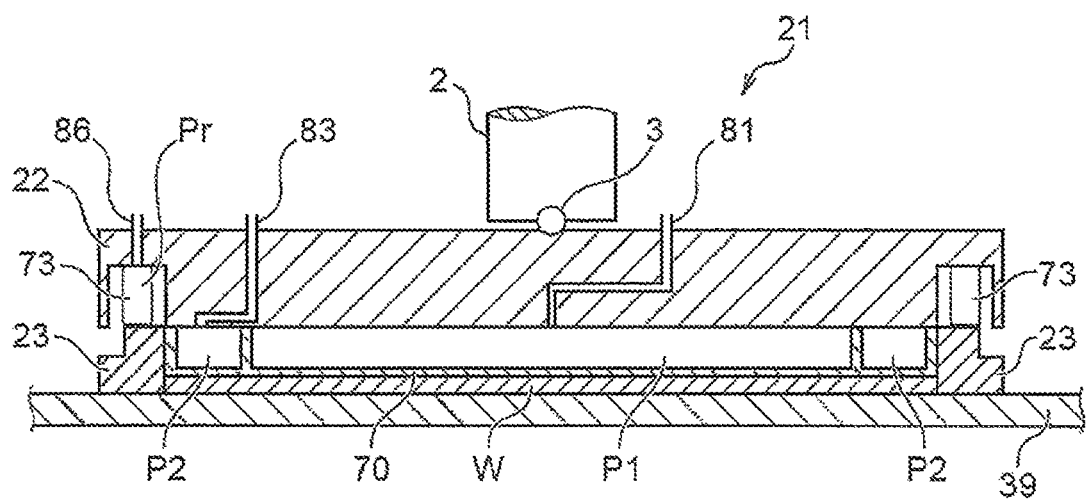
FIG. 4A is a cross-sectional view schematically showing a structure of the substrate holding head according to one embodiment.

FIG. 4A is a cross-sectional view schematically showing the structure of the substrate holding head 21 according to one embodiment. FIG. 4A corresponds to a cross-sectional view seen from a direction of an arrow A in FIG. 4B which is explained later. The substrate holding head 21 is connected to a lower end of the head shaft 2 via the bearing ball 3. The bearing ball 3 is a ball joint which transmits rotation of the head shaft 2 to the substrate holding head 21 while permitting mutual inclination of the substrate holding head 21 and the head shaft 2. The substrate holding head 21 includes the head main body 22 which is substantially disc-shaped and the retainer member 23 disposed at a lower portion of the head main body 22. The head main body 22 can be made of a material with high strength and rigidity such as metal or ceramics. Also, the retainer member 23 can be made of a resin material or ceramics etc. with high rigidity.

Figure 4B:
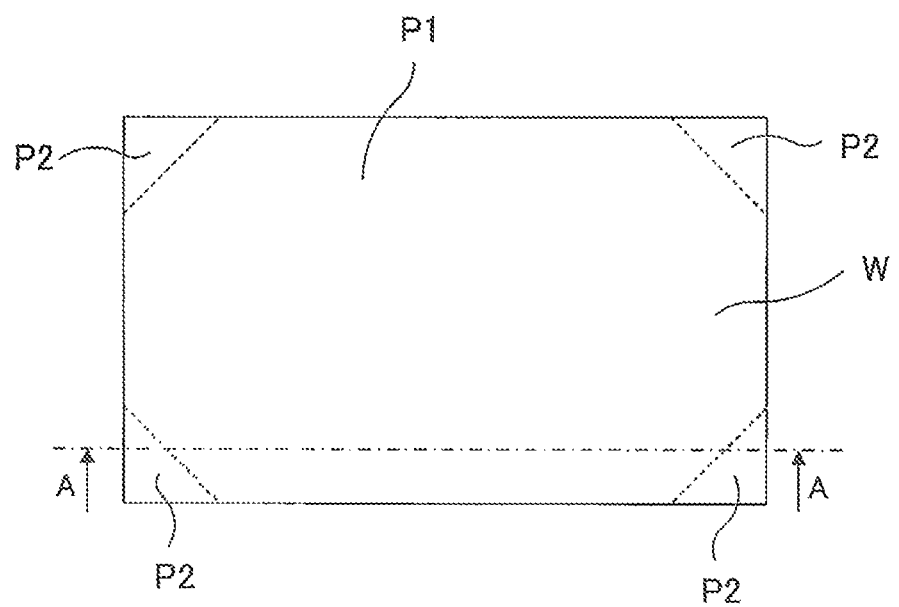
FIG. 4B is a bottom view of the substrate holding head shown in FIG. 4A seen from below.

An elastic pad 70 which abuts the substrate W is housed in a space formed by the head main body 22 and an inner portion of the retainer member 23. A plurality of pressure chambers (air bags) P1, P2 are provided between the elastic pad 70 and the head main body 22. The pressure chambers P1, P2 are formed by the elastic pad 70 and the head main body 22. To the pressure chambers P1, P2, a pressurized fluid such as pressurized air is supplied via fluid paths 81, 83 or vacuuming is executed. The center pressure chamber P1 can have a shape corresponding to a region where excessive polishing of the substrate W is difficult to occur (for example, a center region of the substrate W shown in FIG. 2A), and the pressure chamber P2 can have a shape corresponding to a region where excessive polishing of the substrate W easily occurs (for example, a region at the corner portion of the substrate W shown in FIG. 2A). FIG. 4B is a bottom view of the substrate holding head 21 shown in FIG. 4A seen from below. Additionally, FIG. 4B shows only the substrate W, and the other portions are omitted. FIG. 4B shows an arrangement of the pressure chambers P1, P2 when the substrate W is held by the substrate holding head 21. As described above, the pressure chambers P2 are the region where excessive polishing of the substrate W easily occurs, and as shown in FIG. 4B, are disposed at regions corresponding to positions shown by triangles at the four corners of the quadrate substrate W. The pressure chamber P1 is a region other than the pressure chambers P2. Additionally, as one embodiment, other than the pressure chambers P1, P2, another pressure chamber and a fluid path for supplying a fluid to the other pressure chamber may be provided. The substrate W may be held by the elastic pad 70 of the substrate holding head 21 by vacuuming the other pressure chamber, or the substrate W may be released from the substrate holding head 21 by supplying nitrogen gas, dry air and compressed air etc. to the other pressure chamber. Further, for vacuum absorption of the substrate W to the elastic pad 70 of the substrate holding head 21, any pressure chamber may be formed with a hole in a portion at a side of the substrate.

An inner pressure of the pressure chambers P1, P2 can be changed independently from each other, whereby a pressing force to the center portion and the four corners of the substrate W can be independently adjusted. Further, in a case where a plurality of pressure chambers P2 exist as in the illustrated embodiment, each pressure chamber can control an internal pressure independently from each other. In the embodiment shown in FIG. 4, the elastic pad 70 is configured to form the pressure chambers P1, P2 from one continuous elastic member.

A peripheral end portion of the substrate W is surrounded by the retainer member 23 such that the substrate W does not protrude from the substrate holding head 21 during polishing. An elastic bag 73 is disposed between the retainer member 23 and the head main body 22, and a pressure chamber Pr is formed in the elastic bag 73. The retainer member 23 is relatively vertically movable to the head main body 22 due to expansion/contraction of the elastic bag 73. A fluid path 86 communicates with the pressure chamber Pr, and a pressurized fluid such as pressurized air is supplied to the pressure chamber Pr via the fluid path 86. An internal pressure of the pressurized chamber Pr can be adjusted. Accordingly, a pressing force of the retainer member 23 to the abrasive cloth 39 can be adjusted independently from a pressing force of the substrate W to the abrasive cloth 39. In the substrate holding head 21 according to the embodiment shown in FIG. 4, a plurality of retainer members are provided as shown in FIG. 2 to adjust a pressing force of each retainer member 23 to the abrasive cloth 39 independently for each retainer member 23 by each elastic bag 73. Also, in the substrate holding head 21 according to the embodiments shown in FIG. 4 and FIGS. 5 to 7 which are explained later, as the retainer member 23 and its attachment mechanism and moving mechanism, the structure explained with FIGS. 1, 2 may be adopted.

Figure 5A:
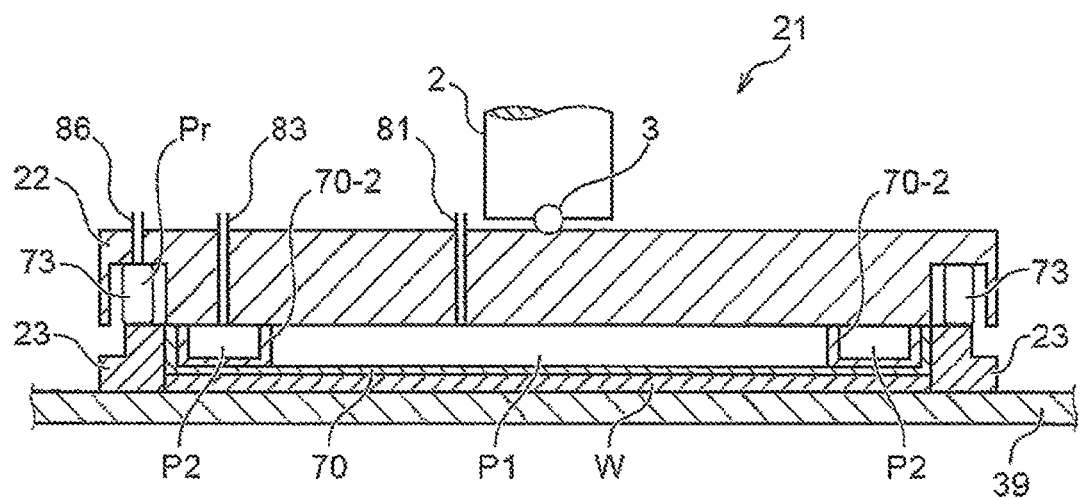
FIG. 5A is a cross-sectional view schematically showing the structure of the substrate holding head according to one embodiment.
Figure 5B:
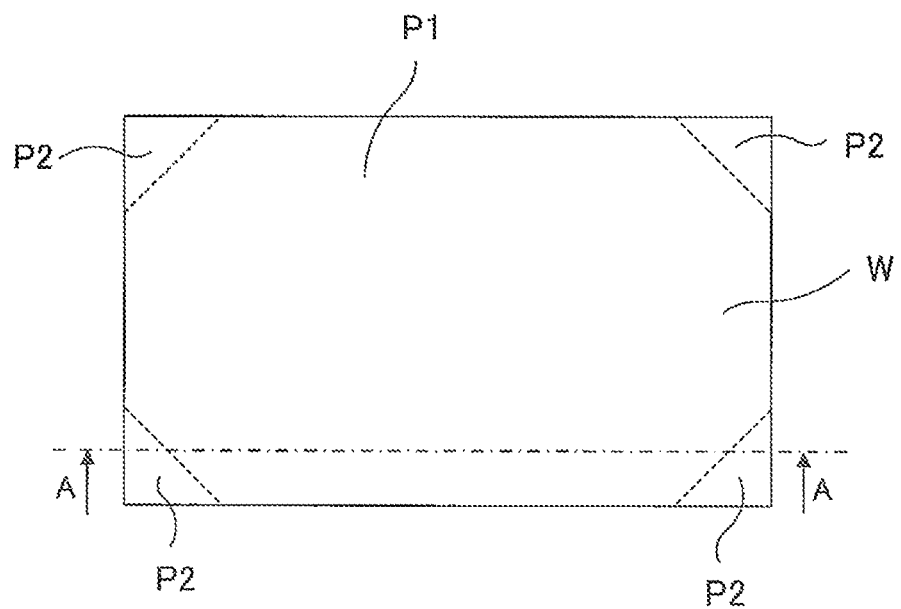
FIG. 5B is a bottom view of the substrate holding head shown in FIG. 5A seen from below.

FIG. 5A is a cross-sectional view schematically showing the structure of the substrate holding head 21 according to one embodiment. FIG. 5A corresponds to a cross-sectional view seen from an arrow A in FIG. 5B which is explained later. The substrate holding head 21 shown in FIG. 5A has the same configuration as in the substrate holding head 21 explained in FIG. 4A excluding a structure of the elastic pad 70 forming the pressure chambers P1, P2. In the substrate holding head 21 according to the embodiment shown in FIG. 5A, the pressure chamber P1 is formed by one elastic pad 70 in the same manner as in FIG. 4A. In the substrate holding head 21 according to the embodiment shown in FIG. 5A, the pressure chamber P2 is formed by an elastic pad 70-2 which is separate from the elastic pad 70 forming the pressure chamber P1, and is formed in a space of the pressure chamber P1. The pressure chamber P2 can also be said as a double structure. Also in the embodiment of FIG. 5A, in the same manner as the embodiment of FIG. 4A, the center pressure chamber P1 can have the shape corresponding to the region where excessive polishing of the substrate W is difficult to occur (for example, the center region of the substrate W shown in FIG. 2A), and the pressure chamber P2 can have the shape corresponding to the region where excessive polishing of the substrate W easily occurs (for example, the region at the corner portion of the substrate W shown in FIG. 2A). FIG. 5B is a bottom view of the substrate holding head 21 shown in FIG. 5A seen from below. Additionally, FIG. 5B shows only the substrate W, and the other portions are omitted. FIG. 5B shows an arrangement of the pressure chambers P1, P2 when the substrate W is held by the substrate holding head 21. As described above, the pressure chambers P2 are the region where excessive polishing of the substrate W easily occurs, and as shown in FIG. 5B, are disposed at regions corresponding to positions shown by triangles at the four corners of the quadrate substrate W. The pressure chamber P1 is a region other than the pressure chambers P2. Additionally, as one embodiment, other than the pressure chambers P1, P2, another pressure chamber and a fluid path for supplying a fluid to the other pressure chamber may be provided. The material of the elastic pad 70 forming the pressure chamber P1 and the material of the elastic pad 70-2 forming the pressure chamber P2 may be the same, or different materials may be used.

Figure 6A:
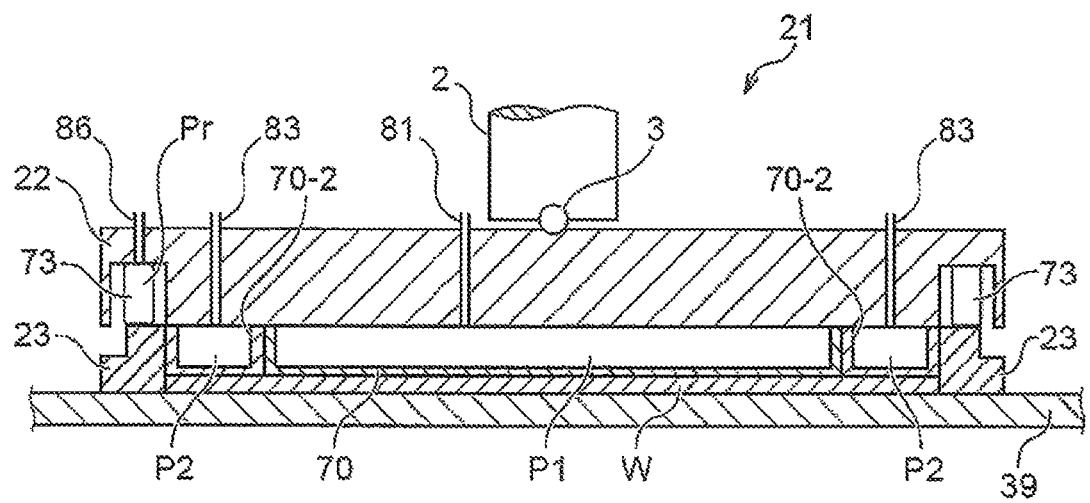
FIG. 6A is a cross-sectional view schematically showing the structure of the substrate holding head according to one embodiment.
Figure 6B:
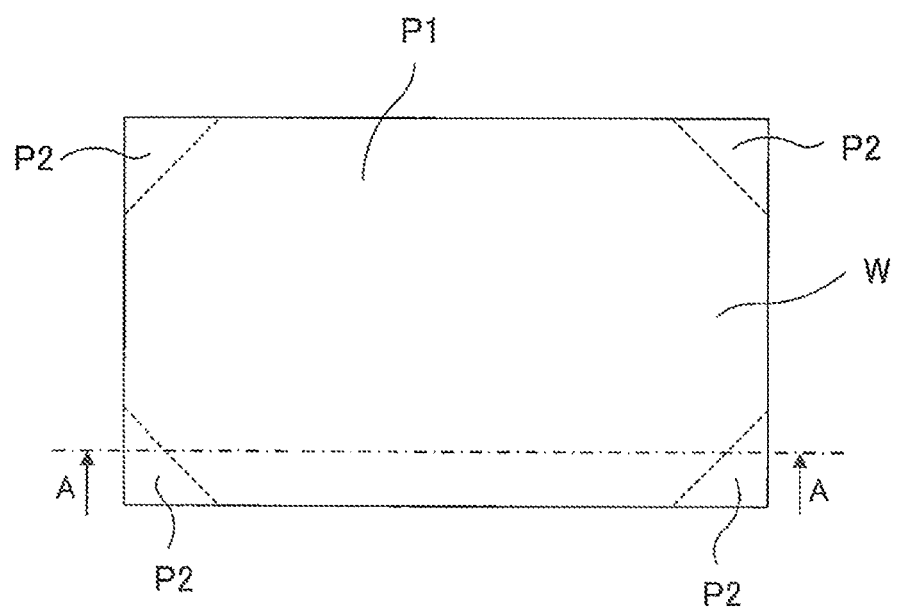
FIG. 6B is a bottom view of the substrate holding head shown in FIG. 6A seen from below.

FIG. 6A is a cross-sectional view schematically showing the structure of the substrate holding head 21 according to one embodiment. FIG. 6A corresponds to a cross-sectional view seen from an arrow A in FIG. 6B which is explained later. The substrate holding head 21 shown in FIG. 6 has the same configuration as in the substrate holding head 21 explained in FIG. 4 excluding a structure of the elastic pad 70 forming the pressure chambers P1, P2. In the substrate holding head 21 according to the embodiment shown in FIG. 6A, the pressure chamber P1 is formed by one elastic pad 70 in the same manner as in FIG. 4A. In the substrate holding head 21 according to the embodiment shown in FIG. 6A, the pressure chamber P2 is formed by an elastic pad 70-2 which is separate from the elastic pad 70 forming the pressure chamber P1, and the pressure chamber P2 is formed to be adjacent to the pressure chamber P1. Also in the embodiment of FIG. 6A, in the same manner as the embodiment of FIG. 4, the center pressure chamber P1 can have the shape corresponding to the region where excessive polishing of the substrate W is difficult to occur (for example, the center region of the substrate W shown in FIG. 2A), and the pressure chamber P2 can have the shape corresponding to the region where excessive polishing of the substrate W easily occurs (for example, the region at the corner portion of the substrate W shown in FIG. 2A). FIG. 6B is a bottom view of the substrate holding head 21 shown in FIG. 6A seen from below. Additionally, FIG. 6B shows only the substrate W, and the other portions are omitted. FIG. 6B shows an arrangement of the pressure chambers P1, P2 when the substrate W is held by the substrate holding head 21. As described above, the pressure chambers P2 are the region where excessive polishing of the substrate W easily occurs, and as shown in FIG. 6B, are disposed at regions corresponding to positions shown by triangles at the four corners of the quadrate substrate W. The pressure chamber P1 is a region other than the pressure chambers P2. Additionally, as one embodiment, other than the pressure chambers P1, P2, another pressure chamber and a fluid path for supplying a fluid to the other pressure chamber may be provided. The material of the elastic pad 70 forming the pressure chamber P1 and the material of the elastic pad 70-2 forming the pressure chamber P2 may be the same, or different materials may be used.

Figure 7A:
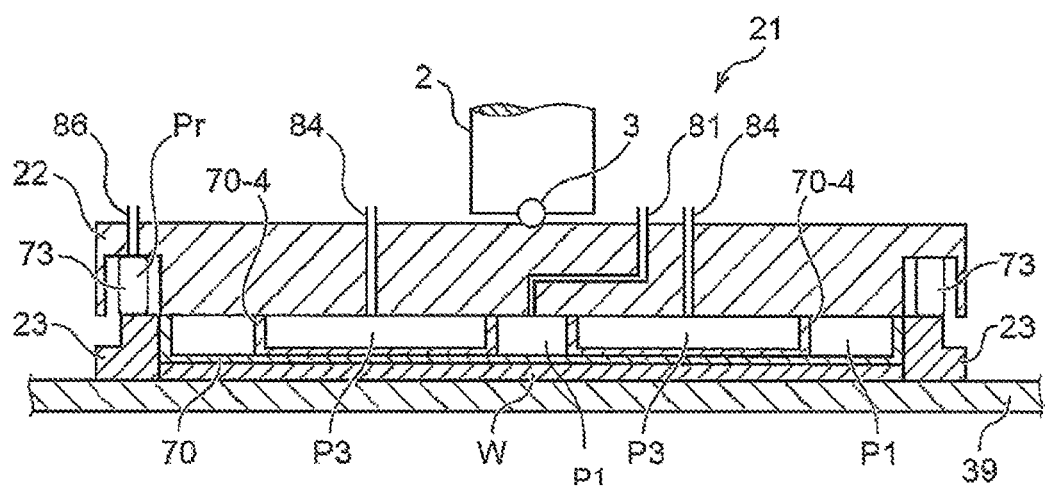
FIG. 7A is a cross-sectional view schematically showing the structure of the substrate holding head according to one embodiment.
Figure 7B:
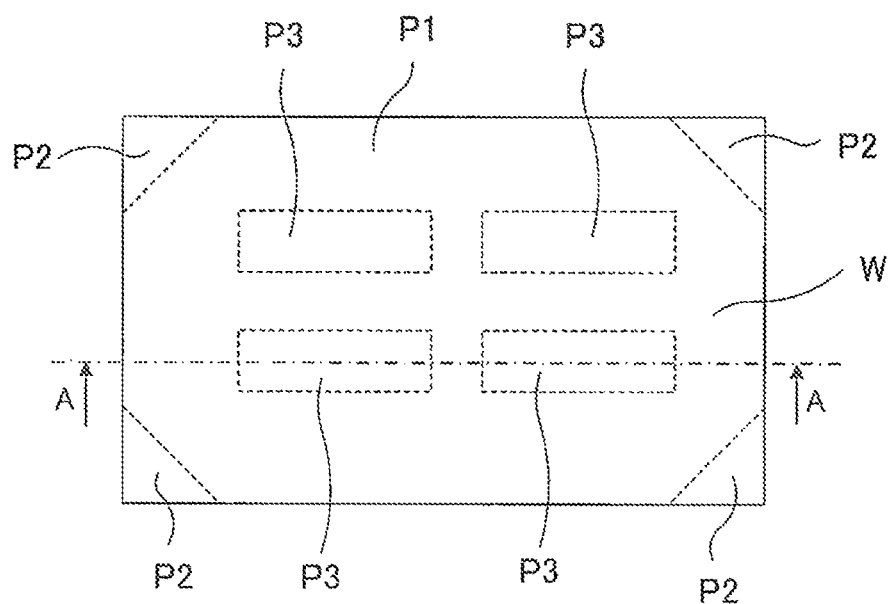
FIG. 7B is a bottom view of the substrate holding head shown in FIG. 7A seen from below.

FIG. 7A is a cross-sectional view schematically showing the structure of the substrate holding head 21 according to one embodiment. FIG. 7A corresponds to a cross-sectional view seen from an arrow A in FIG. 7B which is explained later. The substrate holding head 21 shown in FIG. 7A has the same configuration as in the substrate holding head 21 explained in FIGS. 4 to 6, and further includes an additional pressure chamber P3. The pressure chamber P3 is formed by a separate elastic pad 70-4 in an inner space of the pressure chamber P1. The pressure chamber P3 can also be said as a double structure. To the pressure chamber P3, a pressurized fluid such as pressurized air is supplied via a fluid path 84, or vacuuming is executed. In the embodiment of FIG. 7A, the pressure chamber P3 is basically disposed at a part of a region where excessing polishing is difficult to occur (for example, the center region of the substrate W shown in FIG. 2A). The pressure chamber P3 can be provided to correspond to a position where the substrate which is an object to be polished has a predetermined pattern (a device structure etc.) Accordingly, a pressure can be respectively controlled to a region with a pattern and a region which has no pattern on the substrate, and an amount of polishing at each region can be controlled. FIG. 7B is a bottom view of the substrate holding head 21 shown in FIG. 7A seen from below. Additionally, FIG. 7B shows only the substrate W, and the other portions are omitted. FIG. 7B shows an arrangement of the pressure chambers P1, P2 and P3 when the substrate W is held by the substrate holding head 21. As described above, the pressure chambers P2 are the region where excessive polishing of the substrate W easily occurs, and as shown in FIG. 7B, are disposed at regions corresponding to positions shown by triangles at the four corners of the quadrate substrate W. As described above, the pressure chamber P3 can be provided to correspond to a position where the substrate W which is an object to be polished has the predetermined pattern (the device structure etc.), and as one example, in FIG. 7B, the pressure chambers P3 are provided as four quadrate regions adjacent to the center of the substrate W. The pressure chamber P1 is a region other than the pressure chambers P2 and P3. Additionally, as one embodiment, other than the pressure chambers P1, P2 and P3, another pressure chamber and a fluid path for supplying a fluid to the other pressure chamber may be provided.

Figure 21A:
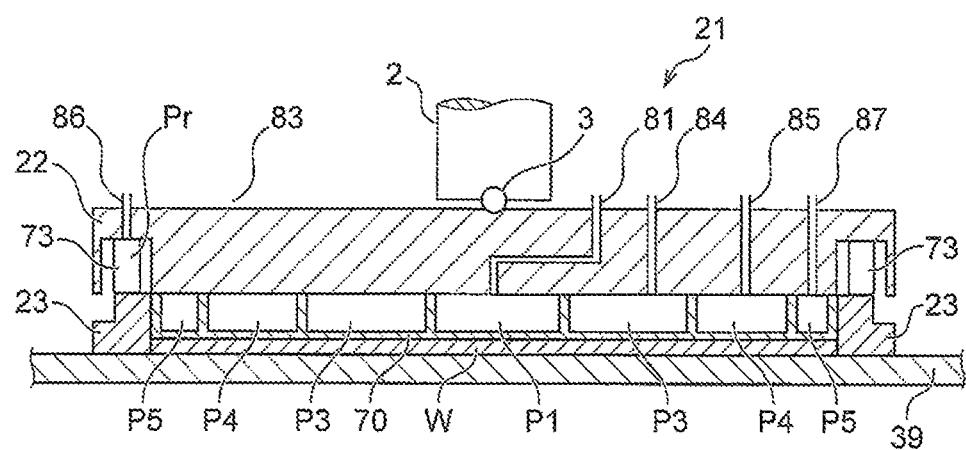
FIG. 21A is a cross-sectional view schematically showing the structure of the substrate holding head according to one embodiment.
Figure 21B:
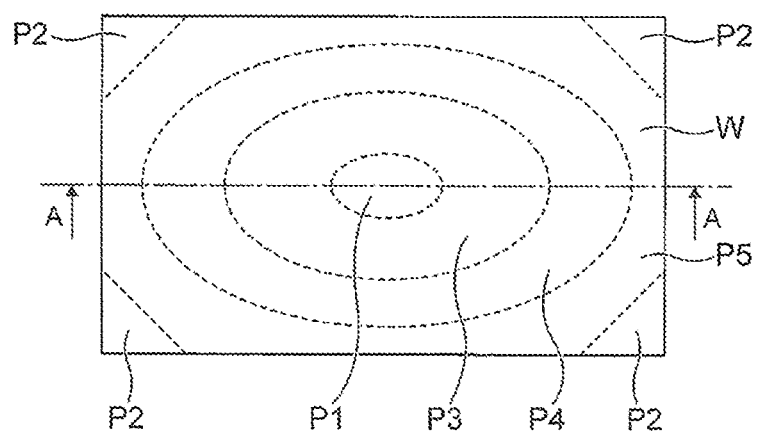
FIG. 21B is a bottom view of the substrate holding head shown in FIG. 21A seen from below.

FIG. 21A is a cross-sectional view schematically showing the structure of the substrate holding head 21 according to one embodiment. FIG. 21A corresponds to a cross-sectional view seen from an arrow A in FIG. 21B which is explained later. The substrate holding head 21 shown in FIG. 21 has the same configuration as in the substrate holding head 21 explained in FIG. 4A excluding a structure of the elastic pad 70 forming pressure chambers P1 to P5. In the substrate holding head 21 according to the embodiment shown in FIG. 21, the pressure chambers P1, P3, P4 and P5 are concentrically formed from a center portion to the outside. The pressure chambers P1 to P5 can be formed by one elastic pad 70 as in the embodiment shown in FIG. 4. Alternatively, all or a part of the pressure chambers P1 to P5 may be formed by different elastic pads. Also, a part of the pressure chambers P1 to P5 may be formed in a double structure as shown in FIG. 7. As shown in FIG. 21A, fluid paths 81, 84, 85 and 87 respectively communicate with the pressure chambers P1, P3, P4 and P5, and by supplying a fluid such as air to the fluid paths 81, 84, 85 and 87, pressure of the pressure chambers P1, P3, P4 and P5 can be independently controlled. FIG. 21B is a bottom view of the substrate holding head 21 shown in FIG. 21A seen from below. Additionally, FIG. 21B shows only the substrate W, and the other portions are omitted. FIG. 21B shows an arrangement of the pressure chambers P1 to P5 when the substrate W is held by the substrate holding head 21. As described above, the pressure chambers P2 are the region where excessive polishing of the substrate W easily occurs, and as shown in FIG. 21B, are disposed at regions corresponding to positions shown by triangles at the four corners of the quadrate substrate W. As described above, the pressure chambers P1, P3, P4 and P5 are concentrically formed from a center portion to the outside. Such arrangement of the pressure chambers is especially effective when a large substrate is polished. In a case of the large substrate, the difference in an amount of polishing may occur in the center portion, an intermediate portion and an end portion of the substrate. Accordingly, by controlling a pressing force to the abrasive cloth 39 at each region of the substrate as in this embodiment, uniformity on a surface in polishing of the substrate can be improved. Additionally, in the embodiment of FIG. 21, the concentric pressure chambers P1, P3, P4 and P5 are divided in four chambers. However, the number of concentric pressure chambers is arbitrary, and a dividing configuration of more than four or less than four may be applied.

Figure 22A:
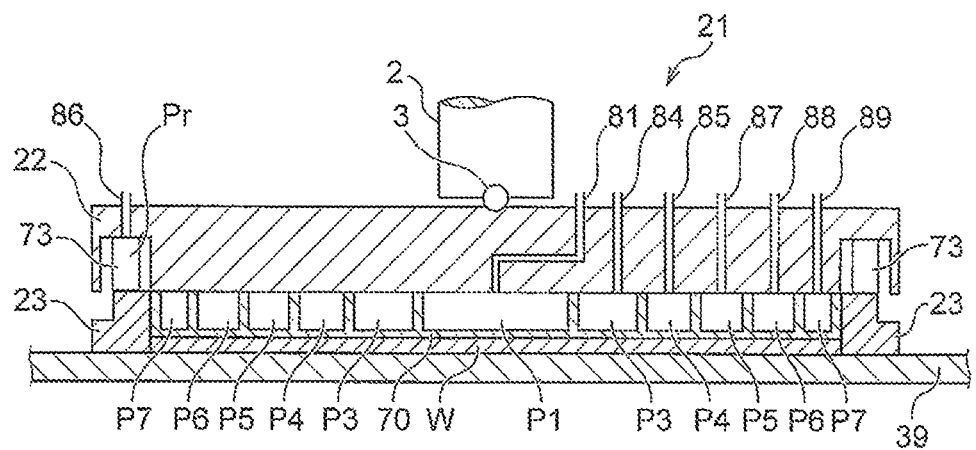
FIG. 22A is a cross-sectional view schematically showing the structure of the substrate holding head according to one embodiment.
Figure 22B:
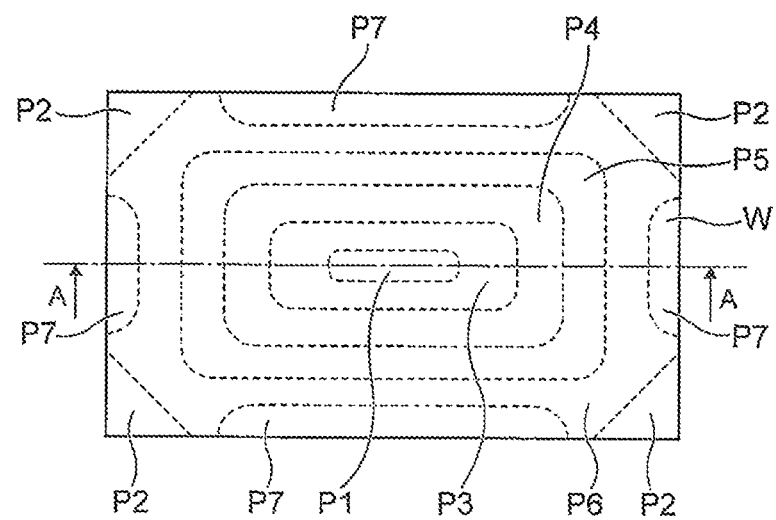
FIG. 22B is a bottom view of the substrate holding head shown in FIG. 22A seen from below.

FIG. 22A is a cross-sectional view schematically showing the structure of the substrate holding head 21 according to one embodiment. FIG. 22A corresponds to a cross-sectional view seen from an arrow A in FIG. 22B which is explained later. The substrate holding head 21 shown in FIG. 22 has the same configuration as in the substrate holding head 21 explained in FIG. 4A excluding a structure of the elastic pad 70 forming pressure chambers P1 to P7. In the substrate holding head 21 according to the embodiment shown in FIG. 22, the pressure chambers P1, P3, P4, P5 and P6 are concentrically formed from a center portion to the outside as in the embodiment shown in FIG. 21. In the embodiment shown in FIG. 22, a pressure chamber P7 is also formed at a position corresponding to the side portion of the substrate W. In the embodiment shown in FIG. 22, four pressure chambers P7 are formed at the side portions. The pressure chambers P1 to P7 can be formed by one elastic pad 70 as in the embodiment shown in FIG. 4. Alternatively, all or a part of the pressure chambers P1 to P7 may be formed by different elastic pads. Also, a part of the pressure chambers P1 to P7 may be formed in a double structure as shown in FIG. 7. As shown in FIG. 22A, fluid paths 81, 84, 85, 87, 88 and 89 respectively communicate with the pressure chambers P1, P3, P4, P5, P6 and P7, and by supplying a fluid such as air to the fluid paths 81, 84, 85, 87, 88 and 89, pressure of the pressure chambers P1, P3, P4, P5, P6 and P7 can be independently controlled. Additionally, in the embodiment of FIG. 22, four pressure chambers P7 are provided. The pressure chambers P7 can be controlled independently. FIG. 22B is a bottom view of the substrate holding head 21 shown in FIG. 22A seen from below. Additionally, FIG. 22B shows only the substrate W, and the other portions are omitted. FIG. 22B shows an arrangement of the pressure chambers P1 to P7 when the substrate W is held by the substrate holding head 21. As described above, the pressure chambers P2 are the region where excessive polishing of the substrate W easily occurs, and as shown in FIG. 22B, are disposed at regions corresponding to positions shown by triangles at the four corners of the quadrate substrate W. As described above, the pressure chambers P1, P3, P4, P5 and P6 are concentrically formed from the center portion to the outside, and the pressure chamber P7 is formed at a position corresponding to the side portion of the substrate W. Such arrangement of the pressure chambers is especially effective when a large substrate is polished. In a case of the large substrate, the difference in an amount of polishing may occur in the center portion, the intermediate portion and the end portion of the substrate. Accordingly, by controlling the pressing force to the abrasive cloth 39 at each region of the substrate as in this embodiment, uniformity on a surface in polishing of the substrate can be improved. Especially, in the embodiment of FIG. 22, an amount of polishing of the side portions, not only the corner portions of the substrate, can be controlled, which improves the uniformity on a surface in polishing the substrate. Additionally, in the embodiment of FIG. 22, the concentric pressure chambers P1, P3, P4, P5 and P6 are divided in five chambers. However, the number of concentric pressure chambers is arbitrary, and a dividing configuration of more than five or less than five may be applied.

In the embodiment shown in FIG. 21, (1) the pressure chambers P2 at the corner portions and (2) a plurality of oval pressure chambers P1, P3 and P4 are combined. In the embodiment shown in FIG. 22, (1) the pressure chambers P2 at the corner portions, (3) a plurality of substantially rectangular pressure chambers P1, P3 to P5 and (4) the pressure chambers P7 at the side portions are combined. These characteristics (1) to (4) of the shape and the arrangement of the pressure chambers can be arbitrarily combined. Also, the number of the pressure chambers can be arbitrary. The center of the plurality of oval pressure chambers P1, P3 and P4 in (2) and the center of the plurality of substantially rectangular pressure chambers P1, P3 to P5 in (3) may be identical, or may be not identical. An appropriate structure of the pressure chamber may be adopted to improve uniformity in polishing the quadrate substrate.

In the embodiment shown in FIGS. 4 to 7 and FIGS. 21 and 22, a contact pressure between the substrate W and the abrasive cloth 39 can be controlled for each region by the pressure chambers P1 to P7. Also, when the pressure chambers P1 to P7 are each constituted by a plurality of chambers, a pressure of respective pressure chambers P1 to P7 can be independently controlled. This prevents partial excessive polishing or insufficient polishing of the substrate, and flatness of the substrate after polishing can be improved.

Figure 8A:
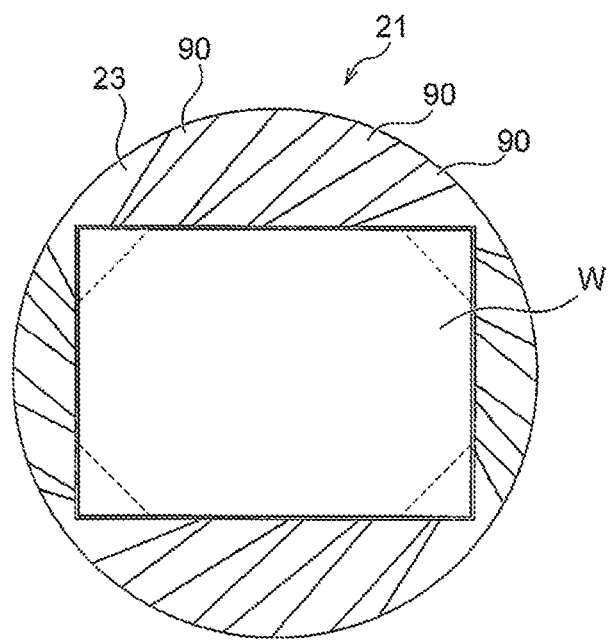
FIG. 8A is a bottom view schematically showing the substrate holding head according to one embodiment.

FIG. 8A is a bottom view schematically showing the substrate holding head 21 according to one embodiment. FIG. 8A shows only the retainer member 23 of the substrate holding head 21 and the substrate W, and the other structures are omitted. In the embodiment of FIG. 8A, the substrate W is quadrate. The substrate holding head 21 of FIG. 8A includes the retainer member 23 having a circular or an oval outer shape. Alternatively, the retainer member 23 may have a substantially quadrate outer shape with curved corner portions. Since the retainer member 23 shown in FIG. 8A is shaped to have no sharp portion, there is no sharp change portion in pressure distribution due to retainer member 23 with respect to the rotation of the retainer member 23. Consequently, even when the quadrate substrate W is disposed at an inner portion of the retainer member 23, pressure distribution is not sharply changed at corner portions, so that uniform polishing can be executed.

In the embodiment shown in FIG. 8A, a plurality of grooves 90 are formed at surfaces toward the abrasive cloth 39 of the retainer member 23. As shown in FIG. 8A, the grooves 90 are formed substantially radially. Accordingly, when the substrate W is polished while the substrate holding head 21 is rotated, slurry can be effectively poured to a surface of the substrate W disposed at the inner portion of the retainer member 23, and refreshing of the slurry can be executed. Also, some of the grooves 90 can be formed such that a width of the grooves becomes larger from a side of the substrate toward the outside. In the grooves 90 of the retainer member 23 shown in FIG. 8A, the width of the groves becomes larger from the side of the substrate toward the outside. Also, as one embodiment, some grooves 90 of the retainer member 23 may be formed such that the width of the grooves 90 becomes larger from the outside toward the side of the substrate, and further, grooves in which the width becomes larger from the side of the substrate toward the outside and grooves in which the width becomes larger from the outside toward the side of the substrate may be mixed. Due to the shape of the grooves 90 of the retainer member 23 and a rotation direction of the substrate holding head 21, pouring of the slurry to the surface of the substrate W and discharge of the slurry from the surface of the substrate W can be executed more effectively. For example, the grooves 90 of the retainer member 23 shown in FIG. 8A are radially formed, and the width of the grooves 90 becomes larger toward the outside of the retainer member 23. Consequently, when the substrate holding head 21 is rotated clockwise seen from an upper side of the paper of FIG. 8A, the slurry can be easily poured to the surface of the substrate W at the time of polishing, on the other hand, when the substrate holding head 21 is rotated counterclockwise, the slurry can be easily discharged from the surface of the substrate W at the time of polishing. In one embodiment, both the groove 90 by which the slurry can be easily poured to the surface of the substrate W at the time of polishing and the groove 90 by which the slurry can be easily discharged from the surface of the substrate W at the time of polishing may be formed to effectively execute circulation of the slurry to the surface of the substrate W.

Figure 8B:
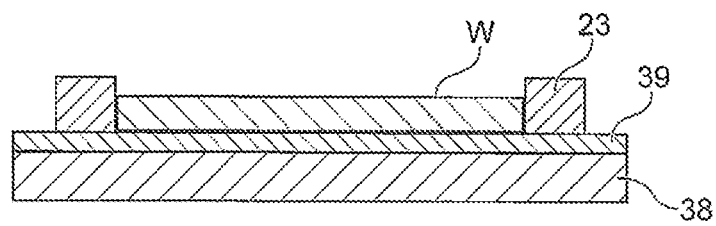
FIG. 8B is a drawing schematically showing a cross section of the substrate holding head shown in FIG. 8A.

FIG. 8B is a drawing schematically showing a cross section of the substrate holding head 21 shown in FIG. 8A. In FIG. 8B, for clarification of illustration, only the retainer member 23, the substrate W, the platen 38 and the abrasive cloth 39 are shown. As the attachment mechanism of the retainer member 23 to the substrate holding head 21, the moving mechanism and a retaining structure of the substrate W etc., an arbitrary structure may be adopted, and for example, the structure explained in FIGS. 1 and 4 may be adopted.

Figure 9:
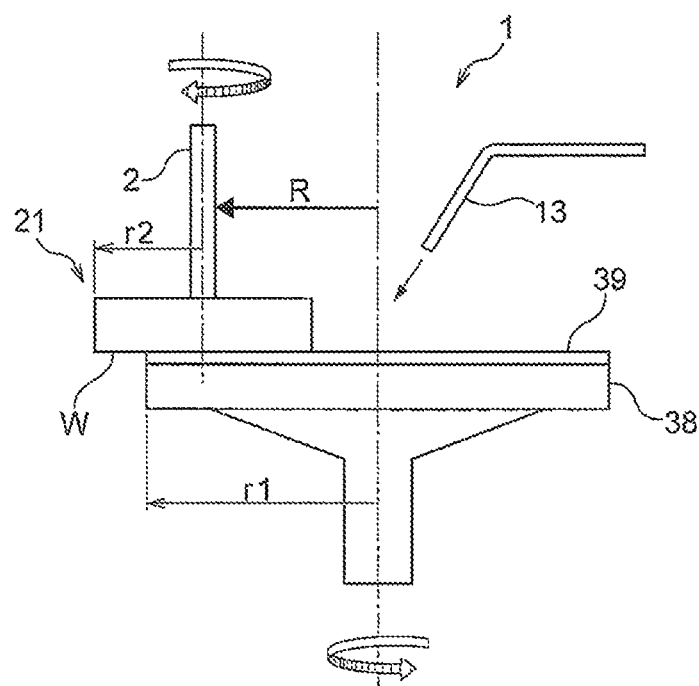
FIG. 9 is a side view schematically showing a polishing apparatus according to one embodiment.

FIG. 9 is a side view schematically showing the polishing apparatus 1 according to one embodiment. The polishing apparatus 1 in FIG. 9 includes the substrate holding head 21 which retains the quadrate substrate W. A detailed structure of the substrate holding head 21 is arbitrary, and for example, the substrate holding head 21 having an arbitrary structure described in the present specification may be adopted. The polishing apparatus 1 of FIG. 9 includes the rotatable platen 38 and the abrasive cloth 39 disposed at the upper surface of the platen 38. Also, the polishing apparatus 1 of FIG. 9 includes the abrasive fluid supply nozzle 13 which supplies slurry to the surface of the abrasive cloth 39. When the substrate W held by the substrate holding head 21 is polished, the substrate holding head 21 is pressed to the abrasive cloth 39, and the platen 38 and the substrate holding head 21 are respectively rotated while the slurry is supplied to the abrasive cloth 39 by the abrasive fluid supply nozzle 13. The polishing apparatus 1 of FIG. 9 includes a moving mechanism which moves the substrate holding head 21 in a direction parallel with the surface of the abrasive cloth 39 (for example, a radial direction of a circular platen 38) during polishing of the substrate W. As shown in FIG. 9, an amount of movement of the substrate holding head 21 by this moving mechanism can be determined such that, when the quadrate substrate W is polished, the substrate W partially protrudes from the abrasive cloth 39. As shown in FIG. 9, the quadrate substrate partially protrudes from the abrasive cloth 39 in a case where, assuming that a maximum distance between a rotation axis of the platen 38 and a rotation axis of the substrate holding head 21 (also called as "a swinging range") is R, a radius of the abrasive cloth 39 is r1 and a radius of the substrate holding head 21 (a radius of a circle which circumscribes the quadrate substrate W) is r2, a moving range of the substrate holding head 21 is controlled such that R>(r1−r2) is achieved. As described above, when the quadrate substrate W is polished, excessive polishing easily occurs at the corners of the substrate W. As in the polishing apparatus 1 of FIG. 9, polishing the substrate W while the substrate holding head 21 is moved such that the quadrate substrate W partially protrudes from the abrasive cloth 39 generates a period that the corner portions of the substrate W do not contact to the abrasive cloth 39 during polishing. As a result, the amount of polishing at the corner portions of the substrate W can be reduced, and excessive polishing of the corner portions can be inhibited. A swinging range R of the substrate holding head 21 can be determined by simulation of the amount of polishing or an experiment.

Additionally, in the polishing apparatus 1 according to the embodiment of FIG. 9, the swinging range R of the substrate holding head 21 is made larger such that the quadrate substrate W partially protrudes from the abrasive cloth 39 during polishing. However, as another embodiment, the swinging range R may be controlled to be smaller. By reducing the swinging range R of the substrate holding head 21, the platen 38 and the abrasive cloth 39 may be made smaller, so that a small polishing apparatus can be achieved. When the swinging range R is made smaller, the swinging range R can be set to 0.1 mm to 50 mm, for example.

Figure 10:
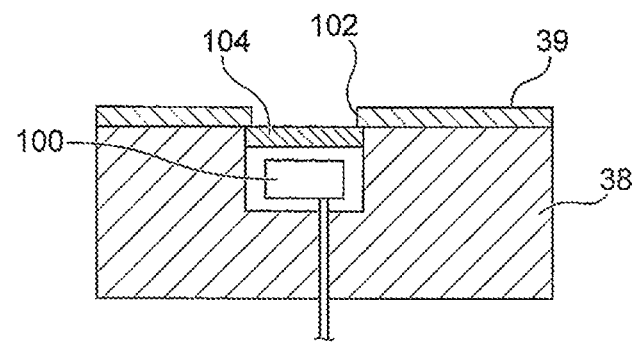
FIG. 10 is a cross-sectional view schematically showing a platen including a sensor according to one embodiment.

In the polishing apparatus 1 shown in FIG. 9, the platen 38 can include a sensor 100 which detects an end point of polishing of the substrate W. FIG. 10 is a cross-sectional view schematically showing the platen 38 including the sensor 100 according to one embodiment. FIG. 10 shows a portion where the sensor 100 of the platen 38 is provided. As shown in FIG. 10, the sensor 100 is disposed in the platen 38. As the sensor 100, an eddy-current sensor, an optical sensor and a fiber sensor etc. can be used. The sensor 100 can communicate with the controller 900 (FIG. 3) by wire or wirelessly. When the optical sensor is used as the sensor 100, a notch 102 is formed at a portion of the abrasive cloth 39. A viewport 104 is provided at the position of the notch 102. Through the viewport 104, the optical sensor can execute light irradiation and detection of a reflected light. From change of a reflection ratio of the substrate W during polishing etc., the end point of polishing of the substrate W can be detected. When the fiber sensor is used as the sensor 100, the viewport 104 may be omitted. In such a case, detection can be executed while pure water is supplied from a periphery of the fiber sensor. A plurality of sensors 100 may be disposed at the platen 38. For example, the sensors 100 may be disposed at a center portion and a peripheral portion of the platen 38, and signals from both sensors 100 may be monitored to determine the end point of polishing of the substrate W. Also, by using the plurality of sensors 100, a film thickness of a polishing surface at plural regions of the substrate W can be monitored. A polishing condition can be controlled based on the signals from the plurality of sensors 100 such that the end points of polishing at the plural regions of the substrate W coincide with each other. For example, the pressing force of the retainer member 23 described above, and pressure of the pressure chambers P1, P2 and P3 can be changed in the embodiments of FIGS. 4 to 7.

As an aspect of refreshing slurry, the following aspect can be achieved. For example, in the embodiment shown in FIG. 3, the head fixing member 4 is attached to the swinging shaft 64, and the substrate holding head 21 is attached to a tip of the head fixing member 4. The substrate holding head 21 and the platen 38 to which the abrasive cloth 39 is attached rotate together to execute polishing of the substrate W attached to the substrate holding head 21. At this time, while process liquid such as slurry is supplied to the abrasive cloth 39 from the process liquid supply nozzle 13, as one embodiment, the head fixing member 4 is pivoted by the swinging shaft 64 such that the head fixing member 4 is regularly retracted from the platen 38, thereby washing out the slurry remained on the abrasive cloth 39. Also, as one embodiment, instead of pivoting the head fixing member 4 by the swinging shaft 64 such that the head fixing member 4 is retracted from the platen 38, the substrate holding head 21 may be moved upward, and the slurry remained on the abrasive cloth 39 may be washed away when the substrate W and the retainer member 23 are away from the abrasive cloth 39 to supply new slurry. These refreshing methods of the slurry are especially effective about a large substrate with a long side exceeding 300 mm. The reason is that, when the large substrate is used, refreshing of the slurry poured in the center portion of the substrate becomes difficult.

Figure 11:
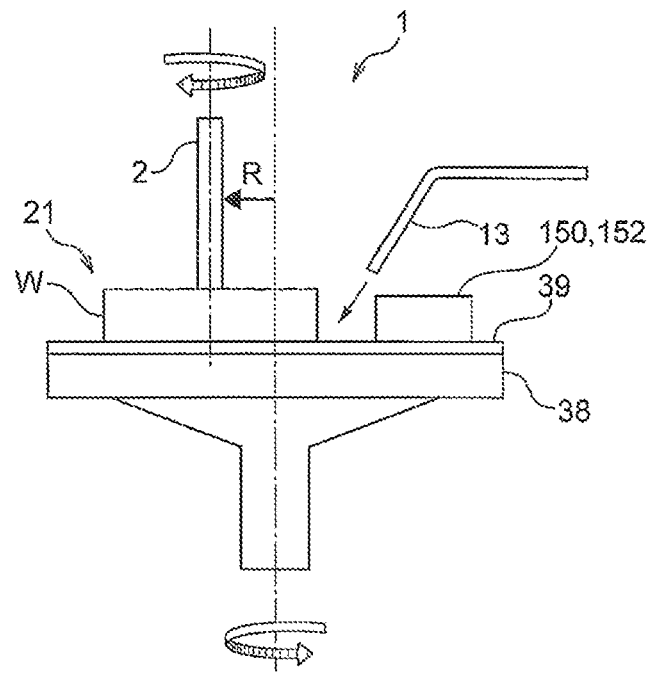
FIG. 11 is a side view schematically showing the polishing apparatus 1 according to one embodiment.

FIG. 11 is a side view schematically showing the polishing apparatus 1 according to one embodiment. The polishing apparatus 1 of FIG. 11 includes the substrate holding head 21 which retains the quadrate substrate W. The detailed structure of the substrate holding head 21 is arbitrary, and for example, the substrate holding head 21 having an arbitrary structure described in the present specification may be adopted. The polishing apparatus 1 of FIG. 11 includes the rotatable platen 38 and the abrasive cloth 39 disposed at the upper surface of the platen 38. Also, the polishing apparatus 1 of FIG. 11 includes the abrasive fluid supply nozzle 13 which supplies slurry to the surface of the abrasive cloth 39. When the substrate W held by the substrate holding head 21 is polished, the substrate holding head 21 is pressed to the abrasive cloth 39, and the platen 38 and the substrate holding head 21 are respectively rotated while the slurry is supplied to the abrasive cloth 39 by the abrasive fluid supply nozzle 13. The polishing apparatus 1 of FIG. 11 includes a temperature controlling portion 150. The temperature controlling portion 150 is for controlling the temperature of the abrasive cloth 39. The polishing apparatus 1 shown in FIG. 11 includes a temperature controlling member 152 which can contact to the abrasive cloth 39. The temperature controlling member 152 can be constituted by a ceramic member with a built-in heater and a ceramic member including a fluid path through which a temperature-adjusted fluid passes etc. The temperature of the abrasive cloth 39 can be controlled by allowing the temperature controlling member 152 under temperature control to contact to the abrasive cloth 39 during polishing of the substrate W. Additionally, a moving mechanism (not shown) which moves the temperature controlling member 152 in a direction parallel with the surface of the substrate W and in a direction perpendicular to the surface of the substrate W is connected to the temperature controlling member 152. With such moving mechanism, the temperature controlling member 152 is appropriately moved during polishing, so that the substrate holding head 21 and the temperature controlling member 152 do not interfere during polishing of the substrate W.

Figure 12:
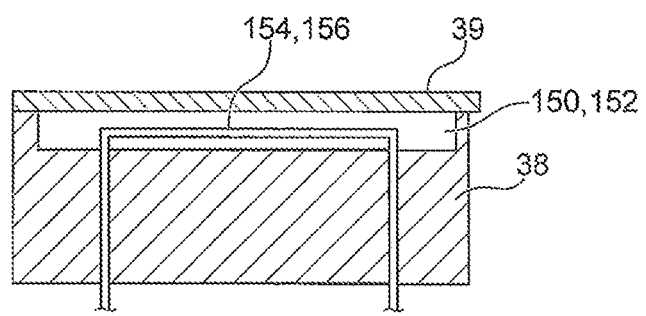
FIG. 12 is a cross-sectional view schematically showing the platen including a temperature controlling portion according to one embodiment.

FIG. 12 is a cross-sectional view schematically showing the platen 38 including the temperature controlling portion 150 according to one embodiment. The platen 38 shown in FIG. 12 includes the temperature controlling member 152 under the abrasive cloth 39. In one embodiment, the temperature controlling member 152 of FIG. 12 includes a heater 154 made of a heating wire etc. Also, as one embodiment, the temperature controlling member 152 of FIG. 12 includes a fluid path 156 through which temperature-adjusted fluid or gas passes. The temperature controlling member 152 can be a ceramic member including the heater 154 or the fluid path 156. The platen 38 shown in FIG. 12 can control the temperature of the abrasive cloth 39 by the temperature-adjusted temperature controlling member 152.

Figure 13:
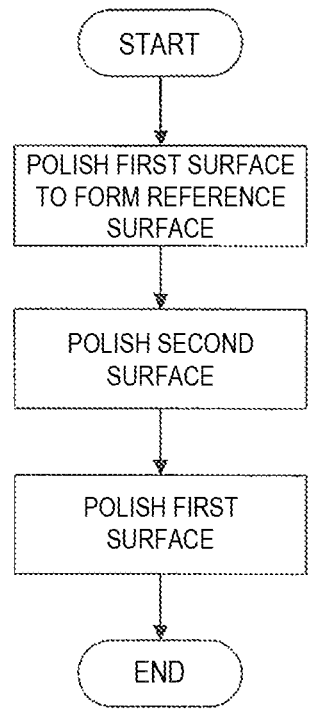
FIG. 13 is a flow chart showing a polishing method according to one embodiment.

FIG. 13 is a flow chart showing a polishing method according to one embodiment. The flow chart of FIG. 13 shows one example of the method of polishing both surfaces of the substrate. To achieve polishing of this method, an arbitrary polishing apparatus may be used, and the polishing apparatus 1 including characteristics described in the present specification may be used, or the other polishing apparatuses may be used. Firstly, to form a reference surface, a first surface of the substrate W which is an object to be polished is polished. At this time, at the first surface, hard back polishing is executed. To execute the hard back polishing, the substrate holding head 21 which has a hard plate such as ceramic is allowed to hold the substrate W. At this time, a hard backing member may be used, or a resin absorption film may be used to attach the substrate W to the substrate holding head 21. When the reference surface is formed on the first surface of the substrate W, next, a second surface opposite from the first surface of the substrate W is polished. In the polishing apparatus 1 which executes the present method, a delivery mechanism for delivering the substrate in the polishing apparatus 1 includes a reverse mechanism which reverses the substrate W. The substrate W is reversed using such reverse mechanism, and the substrate holding head 21 is allowed to hold the substrate W such that the second surface of the substrate W faces the abrasive cloth 39. When the second surface of the substrate W is polished, soft back polishing is executed. When the second surface is polished, the substrate W is reversed again and soft back polishing is executed to the first surface. Additionally, in the polishing apparatus 1 which executes the present method, when hard back polishing is executed at the first surface to form the reference surface, both the substrate holding head for hard back and the substrate holding head for soft back may be provided. Alternatively, when the reference surface is formed, soft back polishing may be executed. Alternatively, instead of polishing both surfaces of the substrate W, only one surface of the substrate W may be polished. For example, the first surface may be polished to form the reference surface, and after that, the substrate may be reversed to polish the second surface. When the substrate is polished, the retainer member 23 and the elastic pad 70 described in the present invention are used, which controls the pressing force of the substrate W to the abrasive cloth 39 and uniformity of polishing can be improved. In a case of hard back polishing, the retainer member 23 may not be used, and a clearance of a groove structure at a periphery of the substrate W in a height direction of the abrasive cloth 39 (a direction perpendicular to the surface of the substrate W) may be adjusted to a range of ±10 µm to 1000 µm.

When the substrate is polished by the polishing apparatus 1 described in the present specification, the polishing can be executed under an arbitrary polishing condition. For example, the polishing can be executed under the following polishing condition. When a large waviness generated on the substrate W is eliminated, stationary abrasive grains can be used. For example, the stationary abrasive grains may be used when the above-described reference surface is formed, and the abrasive cloth 39 including the stationary abrasive grains may be used. As the stationary abrasive grains, for example, the followings are listed. Cerium oxide ($CeO_2$), $SiO_2$, $Al_2O_2$, $ZrO_2$, $MnO_2$, $Mn_2O_3$ and the like are used. When an insulating film is polished, cerium oxide ($CeO_2$), $Al_2O_3$ are preferable; while when a metallic film is polished, $Al_2O_3$, $SiO_2$ and the like are preferable. It is found that polishing with no scratch can be achieved if fine abrasive grains are used as these abrasive grains, and the fine abrasive grains are processed to dispersible granulated powders with a small power to be used for stationary abrasive grains, thereby achieving polishing with no scratch. For example, the abrasive grains have an average particle size of 1.0 µm or less, and an average particle size of 10 µm or less. For example, the stationary abrasive grains having an average particle size of several µm may be used when rough polishing of the substrate is executed, and further, the stationary abrasive grains having an average particle size of several hundreds of nm may be used when finish polishing is executed. These abrasive grains are fixed to a polishing pad etc. using a hard or soft binder. Also, a non-woven fabric polishing member may be used for polishing the substrate. As the non-woven fabric polishing member, as represented by Scotch-Brite (Registered Trademark) for example, one in which polishing abrasive grains are adhered to each synthetic fiber by an adhesive agent can be used. In the non-woven fabric polishing member, depending on its fabric structure, a force applied for polishing is dispersed due to a spring effect (elasticity) of fibers, which prevents excessive shaving or generation of a deep scratch. Also, when the substrate W is polished, slurry used for CMP may be used. As the slurry, for example, polishing abrasive grains constituted by hard inorganic compound grains in which its surface is covered by surfactant such as 2-quinolinecarboxylic acid, oxidant, a polysiloxane coat (the material: oxide, carbide or nitride having a major component of alumina, cerium oxide, or at least one kind of element of Al, Cu, Si, Cr, Ce, Ti, C and Fe, or a mixture or a mixed crystal of each compound described above) and water are included. As the oxidant, for example, hydrogen peroxide ($H_2O_2$), sodium hypochlorite (NaClO) etc. can be used. The content of the polishing abrasive grains in the slurry is preferably 0.1 to 50 weight percent. Also, CMP polishing in which stationary abrasive grains are used for rough polishing of the substrate and slurry is used at the time of finish polishing may be used.

Figure 14:
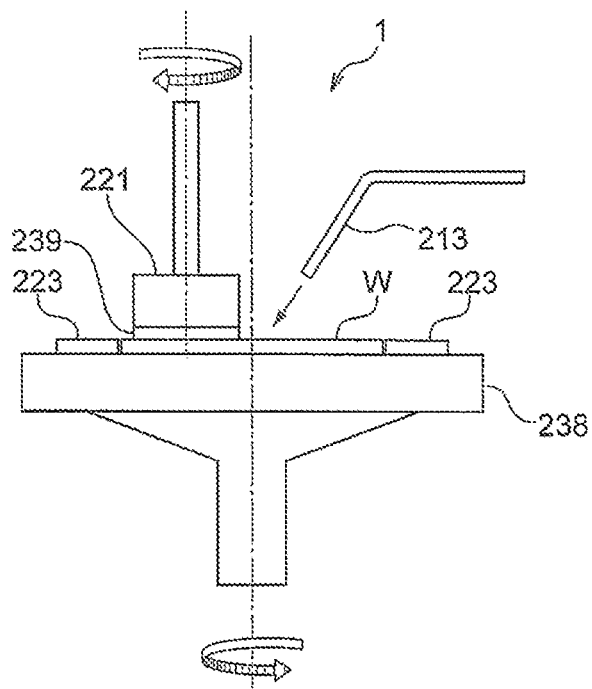
FIG. 14 is a side view schematically showing the polishing apparatus according to one embodiment.

FIG. 14 is a side view schematically showing the polishing apparatus 1 according to one embodiment. The polishing apparatus 1 of FIG. 14 includes a table 238 which holds the quadrate substrate W. The table 238 is rotatable by a motor, for example. Also, the table 238 can fix the quadrate substrate W at its upper surface by vacuum absorption etc. The substrate W is fixed on the table 238 such that a surface to be polished faces upward. Further, on the table 238, a retainer member 223 is provided at a position surrounding the quadrate substrate W. Additionally, in the embodiments shown in FIG. 14 and FIGS. 15 to 19 which are described later, using the elastic pads 70, 70-2, 70-4 etc. forming the pressure chambers P1, P2 and P3 explained in FIGS. 4 to 7, a contact pressure between the substrate W and a polishing pad 239 which is explained later may be controlled for each region. In such a case, the elastic pads 70, 70-2 and 70-4 forming the pressure chambers P1, P2 and P3 and the fluid paths 81, 83 and 84 are provided at the table 238. Alternatively, as one embodiment, to hold the substrate W to the table 238, the above-described hard back method may be used.

Figure 15:
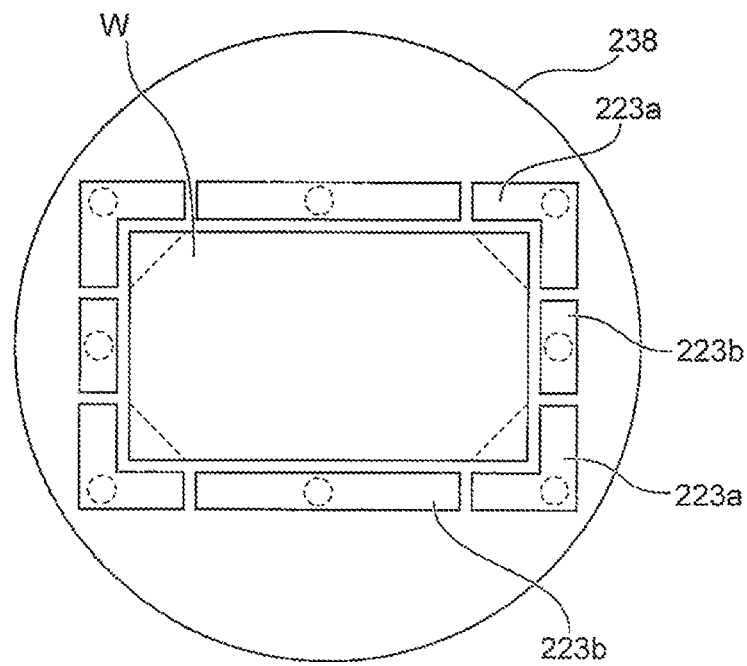
FIG. 15 is a top view of a table of the polishing apparatus shown in FIG. 14 seen from above.

FIG. 15 is a top view of the table 238 of the polishing apparatus 1 shown in FIG. 14 seen from above. In the embodiment shown in FIG. 14, the table 238 includes eight retainer members 223 to surround the quadrate substrate W. Additionally, in FIG. 15, the retainer members disposed adjacent to the corner portions of the substrate W are shown by reference symbol 223a, while the retainer members disposed adjacent to the side portions of the substrate W are shown by reference numeral 223b. Each retainer member 23 uses a similar structure to the attachment structure of the substrate holding head 21 to the retainer member 23 explained with FIGS. 1 and 2 and can be removably fixed to the table 238. Also, like the retainer member 23 which is movable in a direction perpendicular to the surface of the substrate W in the embodiments of FIGS. 1 and 2, also in the embodiment of FIG. 14, in each retainer member 223, a height in a direction perpendicular to a substrate supporting surface of the table 238 can be changed. Typically, in a state that the substrate W is fixed to the table 238, the retainer member 223 is set such that a surface of the retainer member 223 is slightly higher than the surface of the substrate W. In this way, by setting the height of the retainer member 223, when the substrate W is polished, excessive polishing at the end portion of the substrate W, especially at the corner portions can be prevented.

While the table 238 shown in FIGS. 14, 15 are rotatable, as another embodiment, alternatively or additionally, the table 238 may include a moving mechanism which moves the table 238 in a direction parallel with a plane of the substrate W and/or a moving mechanism which moves the table 238 in a direction perpendicular to the plane of the substrate W.

The polishing apparatus 1 shown in FIG. 14 further includes a polishing head 221 which can be rotated by a motor and the like. The polishing pad 239 is attached to the polishing head 221. As one embodiment, a moving mechanism which moves the polishing head 221 in a direction parallel with the plane of the substrate W and a moving mechanism which moves the polishing head 221 in a direction perpendicular to the plane of the substrate are provided. Also, as one embodiment, an area of the polishing pad 239 is smaller than an area of the substrate W.

The polishing apparatus 1 shown in FIG. 14 further includes a nozzle 213 which supplies liquid such as slurry and/or water on the substrate W held on the table 238. When the substrate W held by the table 238 is polished, the polishing head 221 is moved to the substrate W, and the polishing pad 239 is pressed to the substrate W while the polishing head 221 is rotated to polish the substrate W. The polishing head 221 is moved on the substrate W during polishing, and the table 238 is rotated, whereby the entire substrate W can be polished.

Figure 16:
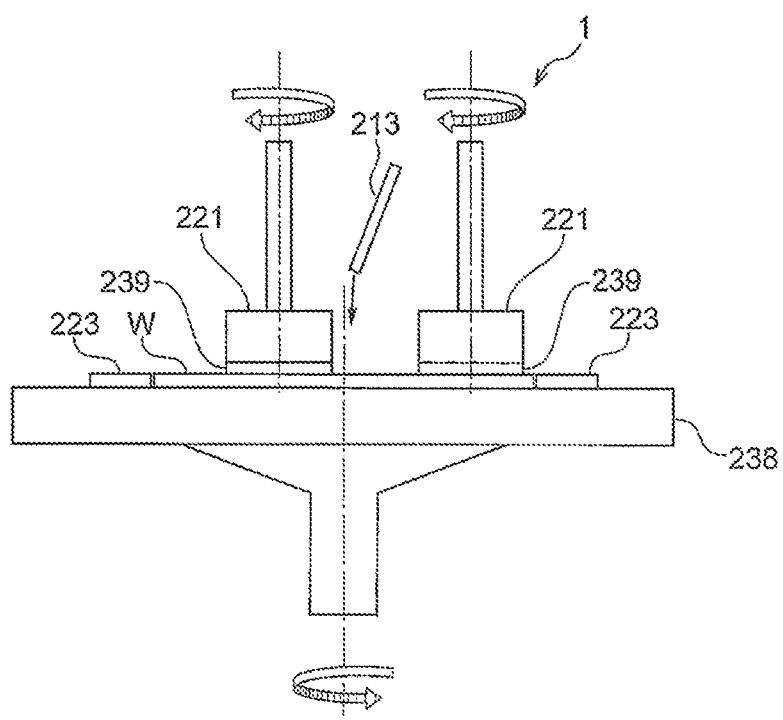
FIG. 16 is a side view schematically showing the polishing apparatus according to one embodiment.

FIG. 16 is a side view schematically showing the polishing apparatus 1 according to one embodiment. The polishing apparatus 1 of FIG. 16 includes the table 238 which holds the quadrate substrate W, the polishing head 221 which is rotatable and the nozzle 213 which supplies liquid such as slurry and/or water on the substrate W held by the table 238. The polishing apparatus 1 shown in FIG. 16 can be the same as the embodiment explained in FIGS. 14, 15 excluding the matter that two polishing heads 221 are provided. Also, instead of two, an arbitrary number of polishing heads 221 may be adopted. Since the polishing apparatus 1 according to the embodiment of FIG. 16 includes a plurality of polishing heads 221, various polishing can be executed. For example, when rough polishing is executed to the entire substrate W, a plurality of polishing heads 221 may execute the polishing simultaneously, while when finish polishing is executed, one polishing head 221 may execute the polishing of the substrate W. Also, the plurality of polishing heads 221 can be controlled independently. Also, as one embodiment, in the polishing apparatus 1 including a plurality of polishing heads 221, at least one polishing head 221 may be a grinding blade (a grind stone) and at least one polishing head 221 may be the polishing pad 239. In such embodiment, a plurality of nozzles 213 may be provided. The plurality of nozzles 213 can be a slurry supply nozzle, a grinding fluid supply nozzle and a pure water supply nozzle, for example. The plurality of nozzles 213 can be switched to be used when grinding is executed, CMP polishing is executed or residual slurry and abrasive grains etc. are washed out. As one embodiment, grinding can be used in rough polishing, and CMP can be used for finish polishing. An advantage of this embodiment is as follows. When the package substrate is polished, in any case where polishing from a resin-molded state or polishing from a state of metal film formation is assumed, a surface state of the package substrate has large irregularities compared to a microfabrication process of semiconductor. CMP is excellent in finish polishing in which small irregularities in the micrometer order to flatness of the nanometer order. On the other hand, grinding is excellent in polishing in which relatively large irregularities, for example from the micrometer order to the millimeter order to flatness of the micrometer order. Thus, rough polishing of the package substrate after film formation is executed by grinding, and when irregularities of the micrometer order is achieved or an amount of polishing to an end point becomes several dozen micrometer or less, finish polishing is executed by CMP, whereby effective polishing with high precision can be achieved.

Figure 17:
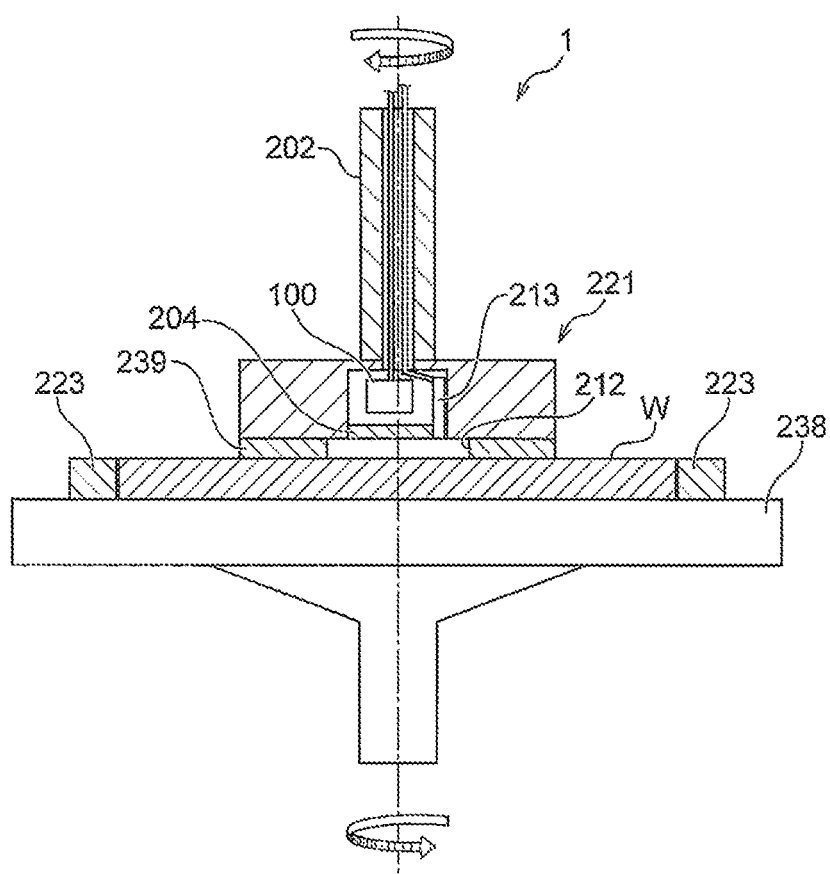
FIG. 17 is a side view schematically showing the polishing apparatus according to one embodiment.

FIG. 17 is a side view schematically showing the polishing apparatus 1 according to one embodiment. The polishing apparatus 1 of FIG. 17 includes the table 238 which holds the quadrate substrate W, the polishing head 221 which is rotatable and the nozzle 213 which supplies slurry and/or liquid such as water on the substrate W held by the table 238. The polishing apparatus 1 shown in FIG. 17 can have the same configuration as the polishing apparatus 1 shown in FIGS. 14, 15 excluding the polishing head 221. In the embodiment shown in FIG. 17, the polishing head 221 includes the sensor 100 which detects the end point of polishing. Like the sensor 100 provided at the platen 38 explained in FIG. 9, as the sensor 100, the eddy-current sensor, the optical sensor and the fiber sensor etc. can be used. The sensor 100 can communicate with the controller 900 (FIG. 3) by wire or wirelessly. As one embodiment, as shown in FIG. 17, wiring for the sensor 100 is allowed to pass through the head shaft 202 of the polishing head 221. As illustrated, the sensor 100 is provided at a place near the substrate W in the polishing head 221. When the sensor 100 is an optical sensor, at the place where the sensor 100 is provided, a notch 212 is provided at the polishing pad 239, and a viewport 204 made of plain glass etc. is disposed at the position of the notch 212. As a result, irradiation of a laser of the optical sensor on the substrate W or measurement of a reflected light from the substrate W can be executed through the viewport 204. Moreover, as one embodiment, the viewport 204 is not necessarily needed. In such a case, detection can be executed while pure water is supplied from a periphery of the sensor 100. Additionally, as shown in FIG. 16, the sensor 100 can be applied to the polishing apparatus 1 including the plurality of polishing heads 221. In such a case, the sensor 100 may be provided at only one of the plurality of polishing heads 221, or the sensors 100 may be respectively provided at each of the plurality of polishing heads 221.

In the embodiment shown in FIG. 17, the nozzle 213 which supplies slurry and/or liquid such as water on the substrate W is provided in the polishing head 221. As shown in FIG. 17, the nozzle 213 is disposed at the viewport 204. The nozzle 213 is connected to a liquid supply source of slurry, pure water and/or cleaning fluid etc. via wiring passing through an inner portion of the head shaft 202 of the polishing head 221. Consequently, in the polishing apparatus 1 shown in FIG. 17, slurry etc. can be directly supplied to a position where the substrate W is polished from the polishing head 221 effectively. Additionally, while both of the sensor 100 and the nozzle 213 are incorporated in the polishing head 221 in FIG. 17, as one embodiment, only one of them may be incorporated in the polishing head 221. For example, in a case where only the sensor 100 is provided at the polishing head 221, as shown in FIG. 14 for example, the nozzle 213 can be disposed at the outside of the polishing head 221. Also, not providing the sensor 100, the nozzle 213 may be provided to the polishing head 221. In such a case, the notch 212 of the polishing pad 239 and the viewport 204 shown in FIG. 17 are unnecessary.

Figure 18:
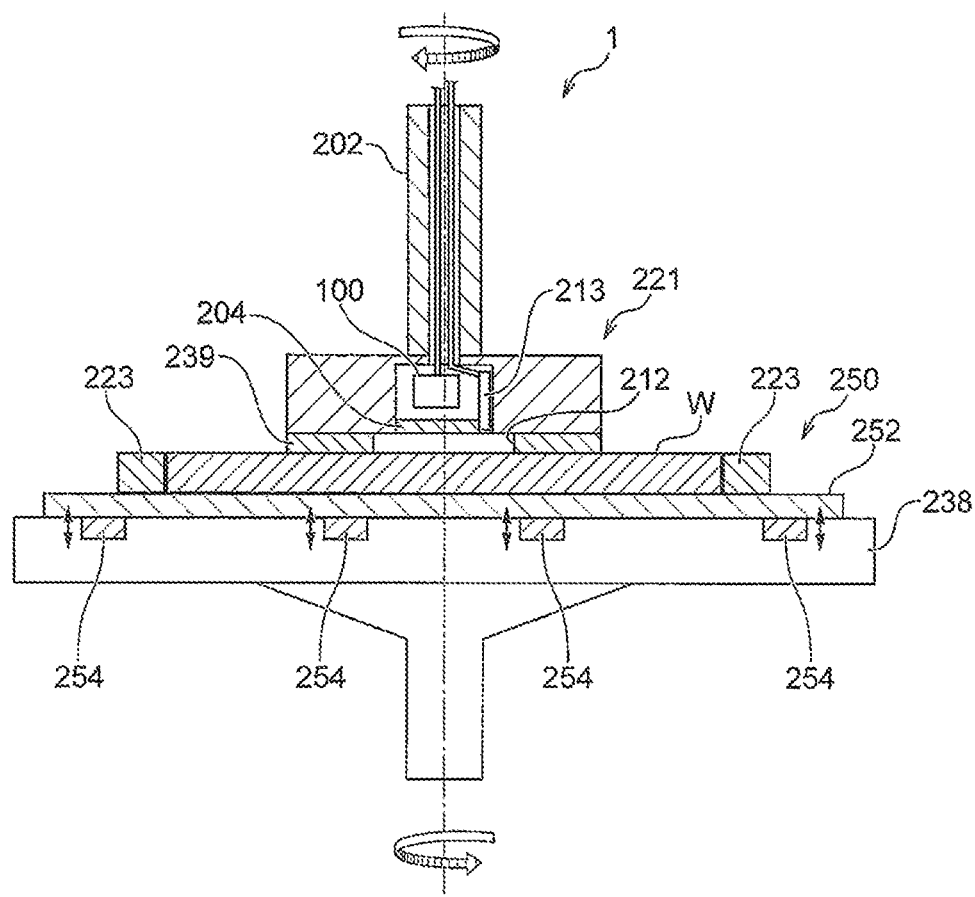
FIG. 18 is a side view schematically showing the polishing apparatus according to one embodiment.

FIG. 18 is a side view schematically showing the polishing apparatus 1 according to one embodiment. The polishing apparatus 1 of FIG. 18 includes the table 238 which holds the quadrate substrate W, the polishing head 221 which is rotatable and the nozzle 213 which supplies slurry and/or liquid such as water on the substrate W held by the table 238. The polishing apparatus 1 shown in FIG. 18 can have an arbitrary configuration excluding the table 238, and for example, can have the same configuration as the polishing apparatus 1 explained with FIGS. 14 to 17. In the embodiment shown in FIG. 18, the table 238 includes a levelness adjustment mechanism 250. The levelness adjustment mechanism 250 includes a flat base 252 disposed at an upper surface of the table 238 and a plurality of height adjustment mechanisms 254 provided below the base 252. By adjusting the height of the plurality of height adjustment mechanisms 254, the inclination of the base 252 can be adjusted. When a large substrate W is polished, the difference at a position in the z direction (a direction perpendicular to the surface of the substrate) is made larger at the end portion of the substrate W if a mounting surface of the substrate W is not horizontal, so that an error in detection of the end point of polishing is made larger. The height adjustment mechanism 254 disposed below the base 252 can be, for example, a piezoelectric element, a microactuator and a movable stage. The adjustment precision of the height adjustment mechanism 254 is preferably about 0.1 μm to 1 μm.

Figure 19:
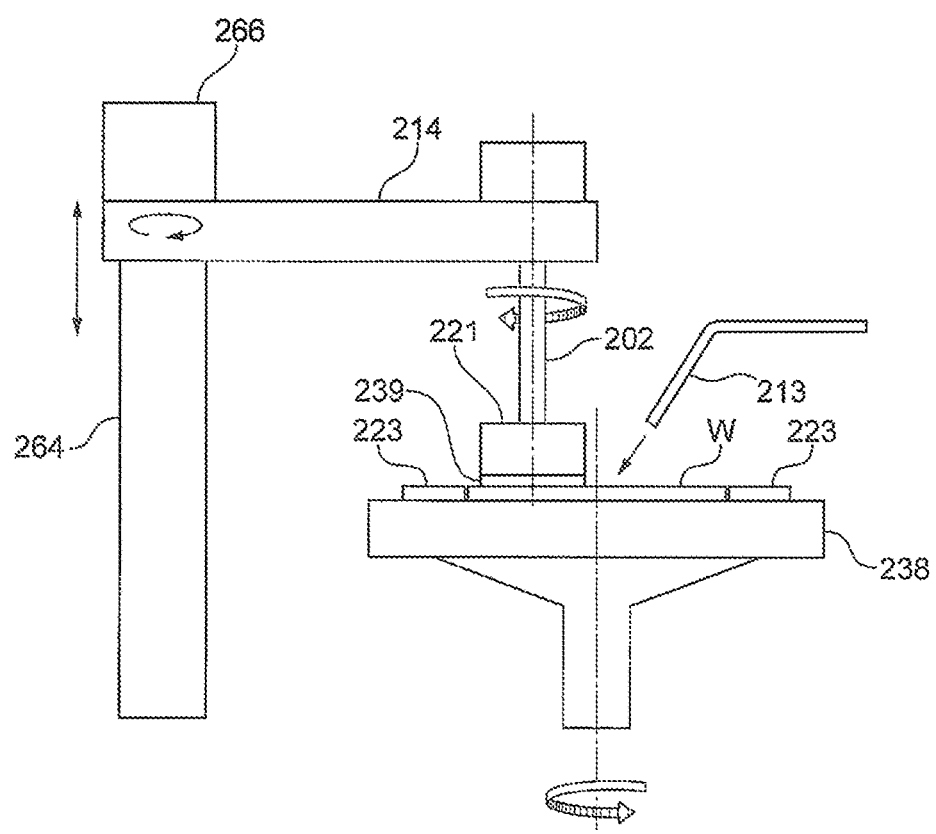
FIG. 19 is a side view schematically showing the polishing apparatus according to one embodiment.

FIG. 19 is a side view schematically showing the polishing apparatus 1 according to one embodiment. The polishing apparatus 1 of FIG. 19 includes the table 238 which holds the quadrate substrate W, the polishing head 221 which is rotatable and the nozzle 213 which supplies slurry and/or liquid such as water on the substrate W held by the table 238. The table 238, the polishing head 221 and the nozzle 213 can have the same configuration as in the embodiment explained with FIGS. 14 to 18. In the polishing apparatus 1 shown in FIG. 19, the polishing head 221 is attached to the head shaft 202. The head shaft 202 is engaged with a head fixing member 214 (also called as an arm) to be freely rotatable via a not shown bearing. Also, an end of the head fixing member 214 is supported by a swinging shaft 264, and the head fixing member 214 can be swung by a swinging motor 266. By swinging the head fixing member 214, the polishing head 221 can be moved in a direction on a surface of the substrate W, whereby the entire substrate W can be polished. In addition, the swinging shaft 264 is movable in a direction perpendicular to the surface of the substrate W, thereby controlling a pressing force of the polishing pad 239 to the substrate. Additionally, a drive mechanism of the polishing apparatus 1 can have the same configuration as explained in FIG. 3. In the polishing apparatus 1 according to the embodiment of FIG. 19, in order to detect the end point of polishing, torque variation is measured by a load cell which measures the pressing force of the polishing pad 239 provided to the head fixing member 214, and/or torque variation due to a motor current variation value of the swinging motor 266 is measured. As a result, detection of the end point of polishing can be executed. In polishing the substrate W by the polishing pad 239, when polishing of a layer to be polished on the substrate W is terminated and a lower layer appears, a sliding resistance between the polishing pad 239 and the surface of the substrate W is changed. By detecting such change as torque variation, detection of the end point of polishing of the substrate W can be executed. In the end point polishing in the embodiment of FIG. 19, when torque variation is measured, due to existence of the head fixing member 214, a force variation between the polishing pad 239 and the substrate W can be effectively measured as current variation. As a result, compared to the conventional detection of the end point in which torque variation of the polishing head 221 or the rotating table 238 is measured, detection of the end point can be executed with high sensitivity in the detection of the end point detection according to this embodiment. Additionally, the polishing apparatus 1 shown in FIG. 19 can have an arbitrary configuration excluding the configuration explained with reference to FIG. 19, and for example, the configuration of the other embodiments explained in the present specification can be used.

Figure 20:
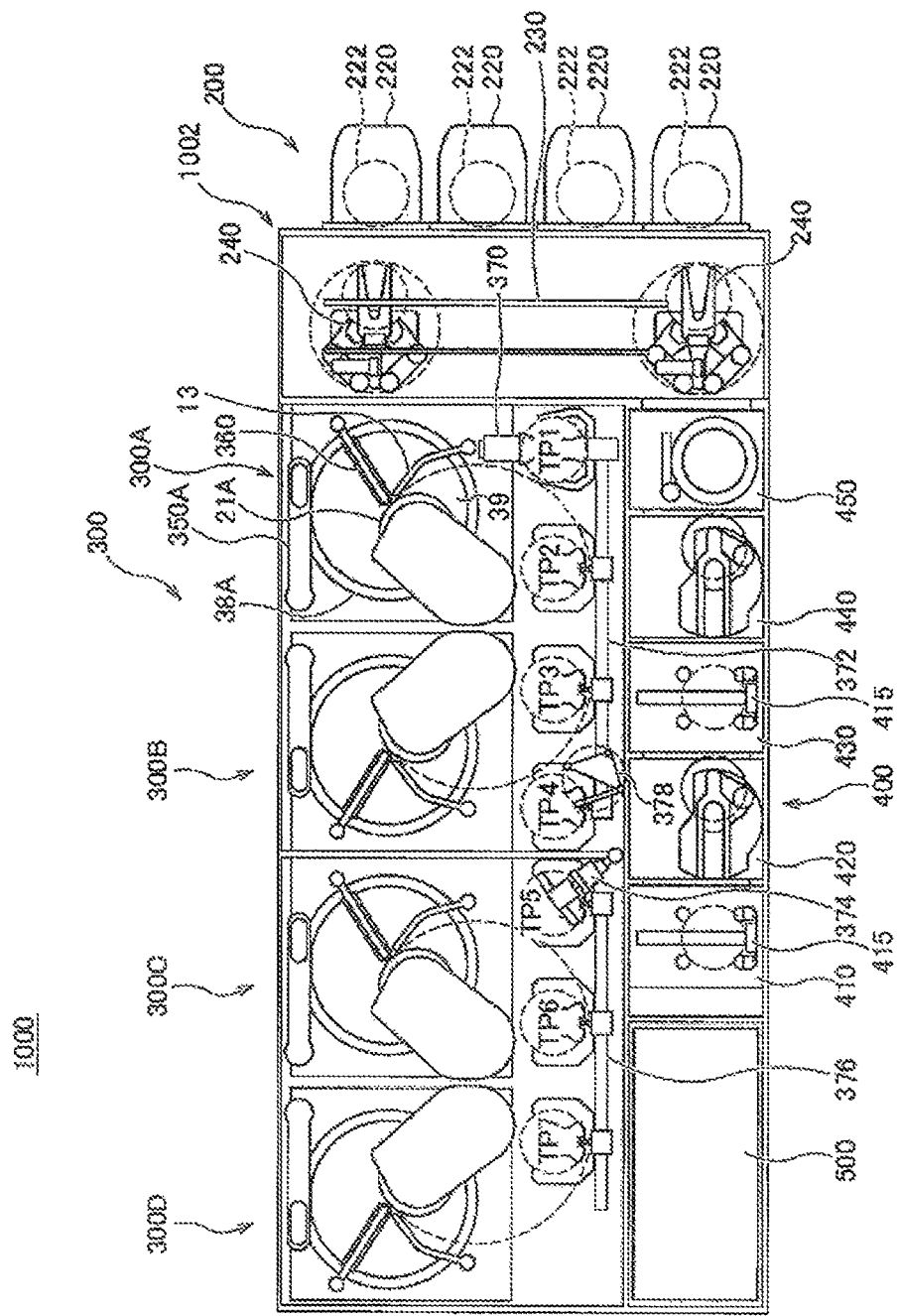
FIG. 20 is a plan view showing an entire configuration of a substrate processing apparatus having the polishing apparatus according to one embodiment.

FIG. 20 is a plan view showing an entire configuration of a substrate processing apparatus 1000 having the polishing apparatus 1 according to one embodiment.

<Substrate Processing Apparatus>

FIG. 20 is a plan view of a substrate processing apparatus 1000. As shown in FIG. 20, the substrate processing apparatus 1000 includes a load/unload unit 2000, a polishing unit 300 and a cleaning unit 4000. Also, the substrate processing apparatus 1000 includes a control unit 500 which controls various operations of the load/unload unit 200, the polishing unit 300 and the cleaning unit 400. Hereinafter, the load/unload unit 200, the polishing unit 300 and the cleaning unit 400 are explained.

<Load/Unload Unit>

The load/unload unit 200 is a unit which transfers the substrate W for which processing such as polishing and cleaning has not yet been executed to the polishing unit 300, and receives the substrate W for which the processing such as polishing and cleaning has been executed from the cleaning unit 400. The load/unload unit 200 includes a plurality of (four in this embodiment) front load portions 220. To each front load portion 220, a cassette 222 for stocking the substrate is mounted.

The load/unload unit 200 includes a rail 230 disposed at an inner portion of a housing 1002 and a plurality of (two in this embodiment) delivery robots 240 disposed on the rail 230. The delivery robot 240 takes out the substrate W for which the processing such as polishing and cleaning has not yet been executed from the cassette 222 to transfer it to the polishing unit 300. Also, the delivery robot 240 receives the substrate W for which the processing such as polishing and cleaning has been executed from the cleaning unit 400 to return it to the cassette 222.

<Polishing Unit>

The polishing unit 300 is a unit which executes polishing of the substrate W. The polishing unit 300 includes a first polishing unit 300A, a second polishing unit 300B, a third polishing unit 300C and a fourth polishing unit 300D. The first polishing unit 300A, the second polishing unit 300B, the third polishing unit 300C and the fourth polishing unit 300D may have the same configuration or different configurations. Also, at least one of the first polishing unit 300A, the second polishing unit 300B, the third polishing unit 300C and the fourth polishing unit 300D can include the polishing apparatus 1 having arbitrary characteristics described in the present specification. As one example, the first polishing unit 300A includes the above-described arbitrary platen 38 and the above-described arbitrary substrate holding head 21. The first polishing unit 300A includes the process liquid supply nozzle 13 which supplies polishing solution or dressing solution to the abrasive cloth 39. The polishing solution is, for example, slurry. The dressing solution is, for example, pure water. Also, the first polishing unit 300A includes a dresser 350A for conditioning of the abrasive cloth 39. Also, the first polishing unit 300A includes an atomizer 360A which sprays liquid or a mixed fluid of liquid and gas to the abrasive cloth 39. The liquid is, for example, pure water. The gas is, for example, nitrogen gas.

Next, the delivery mechanism for delivering the substrate W is explained. The delivery mechanism includes a lifter 370, a first linear transporter 372, a swing transporter 374, a second linear transporter 376 and a temporary table 378.

The lifter 370 receives the substrate W from the delivery robot 240. The first linear transporter 372 delivers the substrate W received from the lifter 370 among a first transfer position TP1, a second transfer position TP2, a third transfer position TP3 and a fourth transfer position TP4. The first polishing unit 300A and the second polishing unit 300B receive the substrate W from the first linear transporter 372 for polishing. The first polishing unit 300A and the second polishing unit 300B transport the polished substrate W to the first linear transporter 372.

The swing transporter 374 delivers the substrate W between the first linear transporter 372 and the second linear transporter 376. The second linear transporter 376 delivers the substrate W received from the swing transporter 374 among a fifth transport position TP5, a sixth transport position TP6 and a seventh transport position TP7. The third polishing unit 300C and the fourth polishing unit 300D receive the substrate W from the second linear transporter 376 for polishing. The third polishing unit 300C and the fourth polishing unit 300D transport the polished substrate W to the second linear transporter 376. The substrate W for which polishing process has been executed by the polishing unit 300 is disposed on the temporary table 378 by the swing transporter 374.

<Cleaning Unit>

The cleaning unit 400 is a unit which executes cleaning process and drying process of the substrate W for which polishing process has been executed by the polishing unit 300. The cleaning unit 400 includes a first cleaning room 410, a first delivery room 420, a second cleaning room 430, a second delivery room 440 and a drying room 450.

The substrate W disposed on the temporary table 378 is delivered to the first cleaning room 410 or the second cleaning room 430 via the first delivery room 420. The substrate W is subjected to cleaning process in the first cleaning room 410 or the second cleaning room 430. The substrate W for which cleaning process is executed in the first cleaning room 410 or the second cleaning room 430 is delivered to the drying room 450 via the second delivery room 440. The substrate W is subjected to drying process in the drying room 450. The substrate W for which drying process is executed is taken out from the drying room 450 by the delivery robot 240 and returned to the cassette 222. As one embodiment, the first cleaning room 410 and the second cleaning room 430 can include a roll sponge type washer 415. The roll sponge type washer 415 is a washer which contacts a rotating roll sponge to the substrate W while supplying cleaning fluid (for example, drug solution and/or pure water) to the substrate W to wash the substrate W. The drying room 450 can include an arbitrary known drying machine.

The control unit 500 controls the entire operation of the substrate processing apparatus 1000. The control unit 500 can be constituted by a general computer which has an input/output device, an arithmetic device and a memory device etc. Also, the control unit 500 can include the controller 900 (FIG. 3) which controls the operation of the above-described polishing apparatus 1.

The above-described polishing apparatus and polishing method can improve uniformity of polishing to the quadrate substrate. These polishing apparatus and polishing method can be applied to polishing of the package substrate on which the electronic device is disposed. For example, they can be applied to polishing a package substrate having an interposer or a rewiring chip embedded type package substrate.

As described above, while the embodiments of the present invention are explained based on several examples, the above embodiments of the invention are merely for easy understanding of the present invention, and do not restrict the present invention. The present invention can be changed and improved without departing the gist of the present invention, and needless to say, equivalents thereof can be included in the present invention. Also, in a range that at least a part of the above-described problem is resolved or a range that at least a part of the effect is provided, any combination or omission of each constituent element described in the claims and the specification can be performed.

REFERENCE SIGNS LIST

1 . . . polishing apparatus
4 . . . head fixing member
13 . . . abrasive fluid supply nozzle
21 . . . substrate holding head
23 . . . retainer member
38 . . . platen
39 . . . abrasive cloth
64 . . . swinging shaft
70 . . . elastic pad
73 . . . elastic bag
90 . . . groove
100 . . . sensor
152 . . . temperature controlling member
214 . . . head fixing member
221 . . . polishing head
223 . . . retainer member
238 . . . table
239 . . . polishing pad
250 . . . levelness adjustment mechanism
252 . . . base
254 . . . adjustment mechanism
264 . . . swinging shaft
266 . . . swinging motor
900 . . . controller
W . . . substrate

The invention claimed is:

1. A polishing apparatus for polishing a quadrate substrate, the polishing apparatus comprising:
a substrate holding portion configured to hold the quadrate substrate, the substrate holding portion comprising:
a quadrate substrate supporting surface for supporting the substrate;
a retainer member disposed at an outside of at least one corner portion of the substrate supporting surface; and
an attachment mechanism configured to attach the retainer member to be disposed at the outside of the at least one corner portion of the substrate supporting surface,
wherein the substrate supporting surface includes a plurality of regions, each region having an elastic film, and the elastic film of each region being independently deformable due to fluid pressure, and
the plurality of regions of the substrate supporting surface include a region corresponding to a corner portion (P2) of the quadrate substrate, a region corresponding to a center portion (P1, P3, P4, P5, P6) of the quadrate substrate, and a region corresponding to a side portion (P7) of the quadrate substrate, the region of the substrate supporting surface corresponding to the corner portion (P2) has a triangle shape including a corner of the substrate supporting surface, the region corresponding to the corner portion being deformable in the triangle shape.

2. The polishing apparatus according to claim 1, further comprising a moving mechanism configured to move the retainer member attached to the substrate holding portion in a direction perpendicular to the substrate supporting surface.

3. The polishing apparatus according to claim 1, further comprising:
a platen that includes a polishing surface for polishing the substrate; and
a substrate holding head configured to hold the substrate to press the substrate to the polishing surface,
wherein the substrate holding head includes the substrate holding portion.

* * * * *